(12) United States Patent
Campbell et al.

(10) Patent No.: US 9,357,682 B2
(45) Date of Patent: *May 31, 2016

(54) COOLING METHOD WITH AUTOMATED SEASONAL FREEZE PROTECTION

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Robert E. Simons, Poughkeepsie, NY (US); Prabjit Singh, Poughkeepsie, NY (US); Jing Zhang, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 621 days.

This patent is subject to a terminal disclaimer.

(21) Appl. No.: 13/758,143

(22) Filed: Feb. 4, 2013

(65) Prior Publication Data

US 2014/0102669 A1   Apr. 17, 2014

Related U.S. Application Data

(63) Continuation of application No. 13/649,334, filed on Oct. 11, 2012.

(51) Int. Cl.
*F28F 13/00* (2006.01)
*H05K 7/20* (2006.01)

(52) U.S. Cl.
CPC ......... *H05K 7/20836* (2013.01); *F28F 2265/14* (2013.01)

(58) Field of Classification Search
CPC .......................... F28F 2265/14; F28F 2265/00
USPC ...................... 210/167.32, 172, 172.1, 257.1; 165/153, 200; 202/153, 185.5, 185.6, 202/185.1; 203/87; 361/698
See application file for complete search history.

(56) References Cited

U.S. PATENT DOCUMENTS

| 3,234,109 A | 2/1966 | Lustenader |
| 3,408,940 A | 11/1968 | McGrogan |

(Continued)

FOREIGN PATENT DOCUMENTS

| DE | 196 49 366 A1 | 4/1998 |
| JP | 62-49419 | 3/1987 |

(Continued)

OTHER PUBLICATIONS

"Emergency and Continuous Exposure Limits for Selected Airborne Contaminates, vol. 2", Committee on Toxicology, Board on Toxicology and Health Hazards, Commission on Life Sciences, National Research Council, pp. 26-33 (2000) (No further date information available. Note that the date of publication is sufficiently older than the earliest priority date of the application, that the month of publication is not an issue.).

(Continued)

*Primary Examiner* — Marc Norman
*Assistant Examiner* — Devon Russell
(74) *Attorney, Agent, or Firm* — Steven Chiu, Esq.; Kevin P. Radigan, Esq.; Heslin Rothenberg Farley & Mesiti P.C.

(57) ABSTRACT

An automated multi-fluid cooling method is provided for cooling an electronic component(s). The method includes obtaining a coolant loop, and providing a coolant tank, multiple valves, and a controller. The coolant loop is at least partially exposed to outdoor ambient air temperature(s) during normal operation, and the coolant tank includes first and second reservoirs containing first and second fluids, respectively. The first fluid freezes at a lower temperature than the second, the second fluid has superior cooling properties compared with the first, and the two fluids are soluble. The multiple valves are controllable to selectively couple the first or second fluid into the coolant in the coolant loop, wherein the coolant includes at least the second fluid. The controller automatically controls the valves to vary first fluid concentration level in the coolant loop based on historical, current, or anticipated outdoor air ambient temperature(s) for a time of year.

12 Claims, 15 Drawing Sheets

(56) References Cited

U.S. PATENT DOCUMENTS

| | | | |
|---|---|---|---|
| 4,080,247 A * | 3/1978 | Malakul | B01D 1/26 159/17.1 |
| 4,303,478 A | 12/1981 | Field | |
| 4,529,413 A | 7/1985 | Ferguson | |
| 4,743,343 A * | 5/1988 | Sakai | B01D 3/346 202/175 |
| 4,770,748 A | 9/1988 | Cellini et al. | |
| 4,865,123 A | 9/1989 | Kawashima et al. | |
| 4,880,504 A | 11/1989 | Cellini et al. | |
| 5,086,829 A | 2/1992 | Asakawa | |
| 5,162,081 A | 11/1992 | Bowes | |
| 5,164,049 A * | 11/1992 | Clark | B01D 1/02 134/12 |
| 5,262,013 A | 11/1993 | Beal et al. | |
| 5,333,677 A | 8/1994 | Molivadas | |
| 5,354,428 A * | 10/1994 | Clark | B01D 1/02 159/DIG. 19 |
| 5,535,877 A | 7/1996 | Eastcott et al. | |
| 5,680,960 A | 10/1997 | Keyes et al. | |
| 5,693,190 A * | 12/1997 | Schneider | C07C 29/80 203/34 |
| 6,023,003 A | 2/2000 | Dunning et al. | |
| 6,170,318 B1 | 1/2001 | Lewis | |
| 6,213,194 B1 | 4/2001 | Chrysler et al. | |
| 6,361,891 B1 | 3/2002 | Breault et al. | |
| 6,365,291 B1 | 4/2002 | Margiott | |
| 6,432,566 B1 | 8/2002 | Condit et al. | |
| 6,496,367 B2 | 12/2002 | Donahoe et al. | |
| 6,528,194 B1 | 3/2003 | Condit et al. | |
| 6,646,879 B2 | 11/2003 | Pautsch | |
| 6,705,089 B2 | 3/2004 | Chu | |
| 6,775,137 B2 | 8/2004 | Chu et al. | |
| 6,792,966 B2 | 9/2004 | Harvey | |
| 6,849,155 B2 | 2/2005 | Akita et al. | |
| 6,973,801 B1 | 12/2005 | Campbell et al. | |
| 6,979,509 B2 * | 12/2005 | Breault | H01M 8/04029 429/438 |
| 7,089,972 B2 | 8/2006 | Kneringer et al. | |
| 7,665,325 B2 | 2/2010 | Campbell et al. | |
| 7,791,882 B2 | 9/2010 | Chu et al. | |
| 8,464,783 B2 * | 6/2013 | Nutsos | C09K 5/20 137/110 |
| 8,591,704 B2 | 11/2013 | Shelley | |
| 2003/0066906 A1 * | 4/2003 | Krause | B01F 15/00175 239/284.1 |
| 2004/0148959 A1 | 8/2004 | Munch et al. | |
| 2004/0182099 A1 | 9/2004 | Hsu | |
| 2005/0122684 A1 | 6/2005 | Chu et al. | |
| 2005/0247440 A1 | 11/2005 | Meissner et al. | |
| 2005/0271908 A1 | 12/2005 | Lin et al. | |
| 2006/0037739 A1 | 2/2006 | Utsunomiya | |
| 2006/0060333 A1 | 3/2006 | Chordia et al. | |
| 2008/0155993 A1 * | 7/2008 | Kuehl | F25B 25/00 62/3.6 |
| 2008/0156031 A1 | 7/2008 | Cur et al. | |
| 2008/0229780 A1 | 9/2008 | Wyatt et al. | |
| 2009/0234705 A1 * | 9/2009 | Brunschwiler | G06F 1/206 62/259.2 |
| 2011/0232869 A1 * | 9/2011 | Petruzzo | G06F 1/20 165/104.14 |
| 2014/0102672 A1 | 4/2014 | Campbell et al. | |

FOREIGN PATENT DOCUMENTS

| | | |
|---|---|---|
| JP | 2002-295848 A | 10/2002 |
| JP | 3698083 B2 | 7/2005 |
| JP | 2007-247506 A | 9/2007 |
| WO | 03/056304 A1 | 7/2003 |
| WO | 2012/010736 A1 | 1/2012 |
| WO | WO 2012/010736 A1 | 1/2012 |

OTHER PUBLICATIONS

M. David et al., "Experimental Characterization of an Energy Efficient Chiller-Less Data Center Test Facility with Warm Water Cooled Servers", Proceedings of the 28th IEEE Semi-Therm Symposium, Mar. 18-22, 2012, San Jose, CA.

M. Iyengar et al., "Server Liquid Cooling of Chiller-Less Data Center Design to Enable Savings", Proceedings of the 28th IEEE Semi-Therm Symposium, Mar. 18-22, 2012, San Jose, CA.

K-Patents Process Instruments, "Aviation De-Icing Fluid Spraying and Recovery: Ethylene Glycol CH2OH2, Propylene Glycol C3H8O2", www.kpatents.com, 2 pages (Apr. 6, 2003).

"Emergency and Continuous Exposure Limits for Selected Airborne Contaminates, vol. 2", Committee on Toxicology, Board on Toxicology and Health Hazards, Commission on Life Sciences, National Research Council, pp. 26-33 (2000).

L. Campbell et al., "Controlled Cooling of an Electronic System for Reduced Energy Consumption", U.S. Appl. No. 13/527,863, filed Jun. 20, 2012.

L. Campbell et al., "Cooling System with Automated Seasonal Freeze Protection", U.S. Appl. No. 13/649,334, filed Oct. 11, 2012.

Campbell et al., Office Action for U.S. Appl. No. 13/649,334, filed Oct. 11, 2012 (U.S. Patent Publication No. 2014/0102672 A1), dated Mar. 31, 2015 (11 pages).

Campbell et al., Final Office Action for U.S. Appl. No. 13/649,334, filed Oct. 11, 2012 (U.S. Patent Publication No. 2014/0102672 A1), dated Aug. 26, 2015 (13 pages).

Campbell et al., Office Action for U.S. Appl. No. 13/649,334, filed Oct. 11, 2012 (U.S. Patent Publication No. 2014/0102672 A1), dated Dec. 30, 2015 (12 pages).

* cited by examiner

COOLING METHOD WITH AUTOMATED SEASONAL FREEZE PROTECTION

CROSS-REFERENCE TO RELATED APPLICATION

This application is a continuation of U.S. Ser. No. 13/649,334, filed Oct. 11, 2012, and entitled "Cooling System with Automated Seasonal Freeze Protection", and which is hereby incorporated herein by reference in its entirety.

STATEMENT REGARDING FEDERALLY SPONSORED RESEARCH

This invention was made with Government support under Contract No. DE-EE0002894, awarded by the Department of Energy. Accordingly, the U.S. Government has certain rights in the invention.

BACKGROUND

As is known, operating electronic components, such as electronic devices, produce heat. This heat should be removed from the devices in order to maintain device junction temperatures within desirable limits, with failure to remove heat effectively resulting in increased device temperatures, and potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. For example, power dissipation, and therefore heat production, increases as device operating frequencies increase. Also, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices, and electronic system containing such devices, solely by traditional air cooling methods, such as by using air cooled heat sinks with heat pipes or vapor chambers. Such air cooling techniques are inherently limited in their ability to extract heat from electronic components with moderate to high power density.

BRIEF SUMMARY

In one aspect, a method is provided which includes: obtaining a coolant loop configured to circulate coolant therethrough and facilitate cooling of at least one electronic component, wherein at least a portion of the coolant loop is to be exposed to outdoor ambient air temperature(s) during normal operation; providing at least one coolant tank comprising a first reservoir containing at least partially a first fluid and a second reservoir containing at least partially a second fluid, the first fluid freezing at a lower temperature than the second fluid, the second fluid having superior cooling properties compared with the first fluid, and the first fluid and the second fluid being soluble fluids; providing multiple valves for selectively coupling in fluid communication the at least one coolant tank to the coolant loop to controllably couple at least one of the first fluid in the first reservoir or the second fluid in the second reservoir into the coolant loop to vary a concentration level of the first fluid in the coolant within the coolant loop, wherein the coolant within the coolant loop comprises at least the second fluid; and providing a controller to automatically control the multiple valves and vary the concentration level of the first fluid in the coolant within the coolant loop based on at least one of historical, current, or anticipated outdoor ambient air temperature(s) for a time of year.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
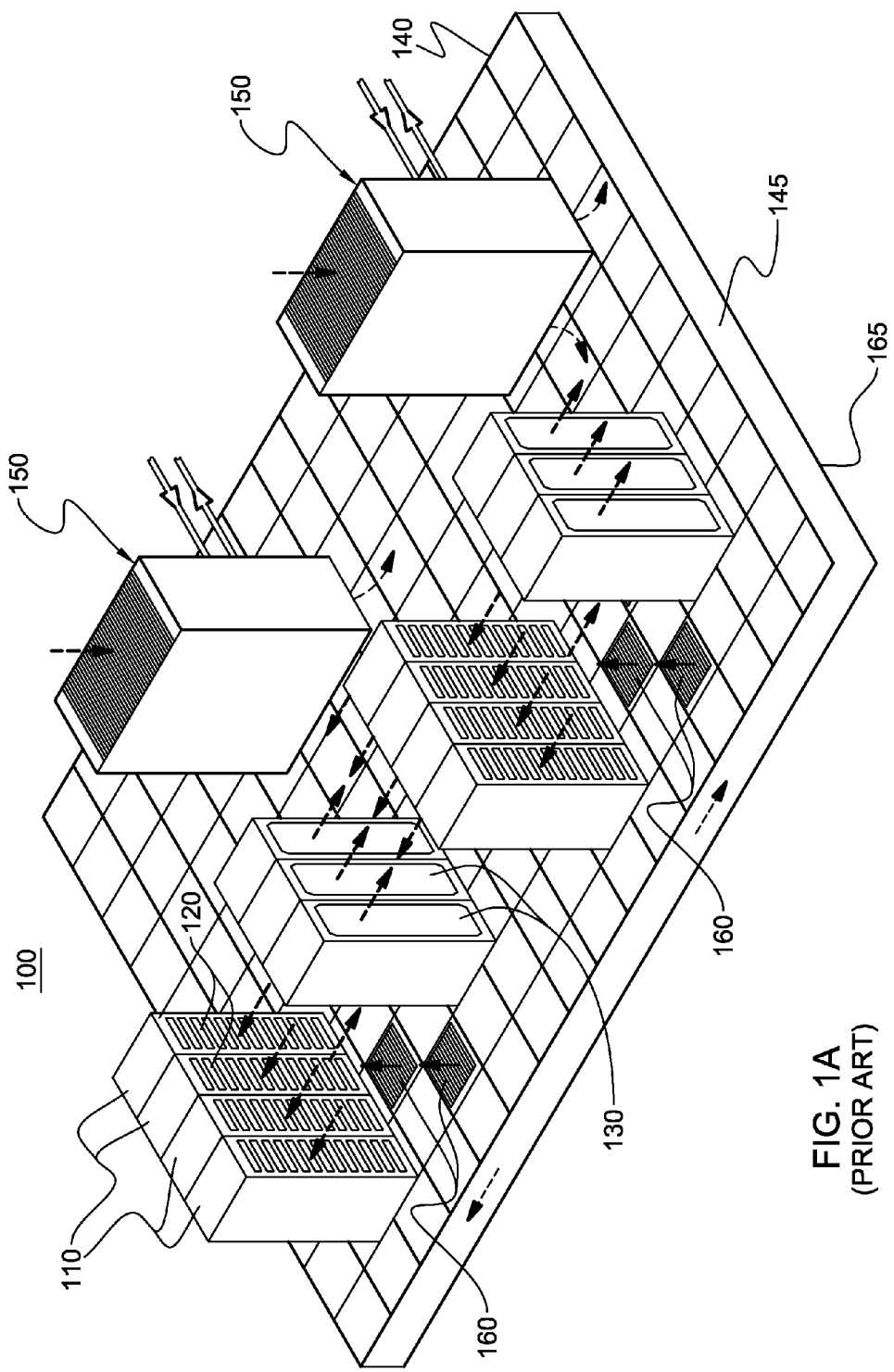
FIG. 1A depicts one embodiment of a conventional raised floor layout of an air-cooled data center.

As used herein, the terms "electronics rack", and "rack unit" are used interchangeably, and unless otherwise specified include any housing, frame, rack, compartment, blade server system, etc., having one or more heat-generating components of a computer system or electronic system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) may be movable or fixed, for example, relative to an electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards. In one implementation, an electronics card may comprise a plurality of memory modules (such as one or more dual in-line memory modules (DIMMs)).

Further, as used herein, the terms "coolant-cooled structure", "coolant-cooled cold plate" and "coolant-cooled cold rail" refer to structures having one or more channels (or passageways) formed therein or passing therethrough, which facilitate the flow of coolant (such as liquid coolant) through the structure. A coolant-cooled structure may be, for example, a coolant-cooled cold plate, or a coolant-cooled cold rail, or a coolant manifold. In one example, tubing is provided extending through the coolant-cooled structure. An "air-to-coolant heat exchanger" or "air-to-coolant heat exchange assembly" means any heat exchange mechanism characterized as described herein through which coolant can circulate; and includes, one or more discrete air-to-coolant heat exchangers coupled either in series or in parallel. An air-to-coolant heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-coolant heat exchanger can vary without departing from the scope of the invention disclosed. A "liquid-to-liquid heat exchanger" may comprise, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Still further, "data center" refers to a computer installation containing one or more electronics racks to be cooled. As a specific example, a data center may comprise one or more rows of rack-mounted computer units, such as server units.

One example of coolant used within the cooling systems and cooled electronic systems disclosed herein is water. However, the concepts presented are readily adapted to use with other types of coolant. For example, unless otherwise specified, the coolant may comprise a brine, a glycol mixture, a fluorocarbon liquid, or other coolant, or refrigerant, while still maintaining the advantages and unique features of the present invention.

Reference is made below to the drawings, which are not drawn to scale for ease of understanding, wherein the same reference numbers used throughout different figures designate the same or similar components.

FIG. 1A depicts a raised floor layout of an air cooled data center 100 typical in the prior art, wherein multiple electronics racks 110 are disposed in one or more rows. A data center such as depicted in FIG. 1A may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more computer room air-conditioning (CRAC) units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Figure 1B:
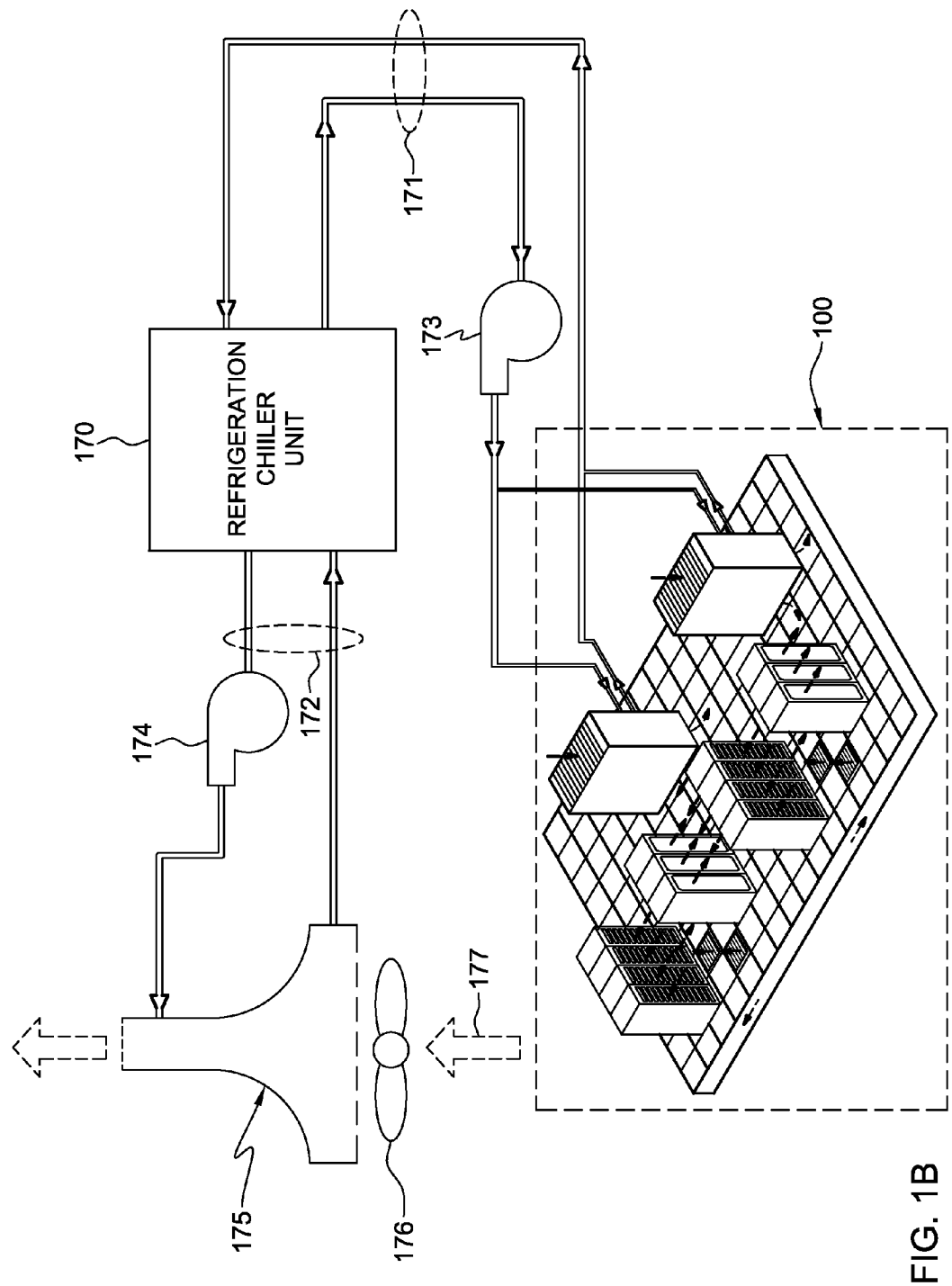
FIG. 1B depicts one embodiment of a cooling facility for an air-cooled data center such as depicted in FIG. 1A.

FIG. 1B depicts one embodiment of facility-level cooling to facilitate heat transfer from the electronics racks of the data center 100 to ambient outdoor air 177 being drawn via one or more air-moving devices 176 through a cooling tower 175, such as a wet cooling tower. As described above in connection with FIG. 1A, data center 100 includes one or more electronics (or IT) racks arranged in one or more rows to form aisles. Chilled air enters the floor via, for example, one or more perforated floor tiles, passes through the racks, becomes heated in the process, and then is drawn to the intake of a computer room air-conditioning unit disposed within data center 100. The computer room air-conditioning unit cools the hot air and provides the chilled air to the underfloor plenum. In one embodiment, the computer room air-conditioning units are chilled via facility coolant coupled to a facility coolant loop 171 connecting in fluid communication a refrigeration chiller unit 170 and the computer room air-conditioning units of data center 100. The chilled facility coolant, such as chilled water, allows the computer room air-conditioning units to supply chilled air to the underfloor plenum of the data center, typically in the 15° C.-32° C. range, with 24° C.-27° C. being the long-term recommended temperature band.

Figure 2:
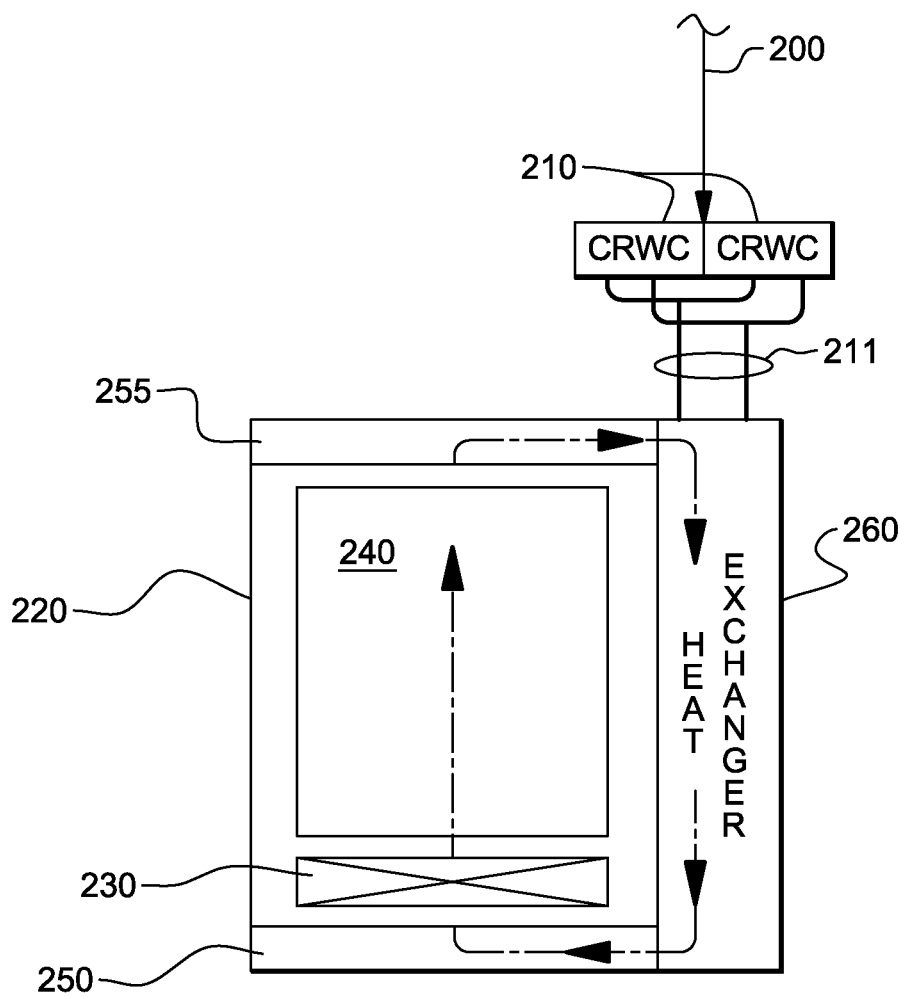
FIG. 2 is a cross-sectional plan view of one embodiment of an electronics rack with an attached air-to-liquid heat exchanger enhancing cooling of air passing through the electronics rack.
Figure 3:
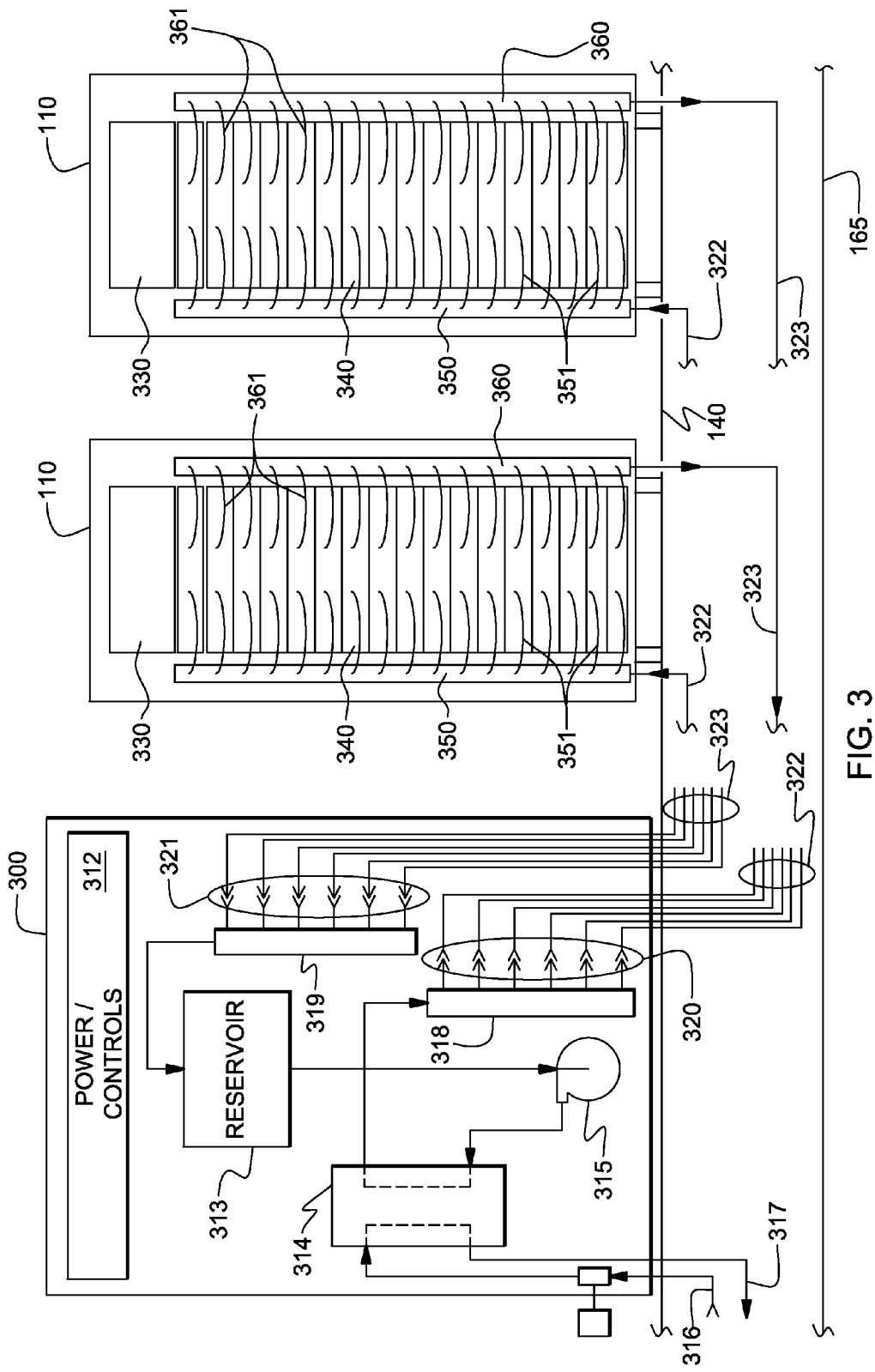
FIG. 3 depicts one embodiment of a data center with a coolant distribution unit facilitating liquid-cooling of one or more coolant-cooled electronics racks of the data center, in accordance with one or more aspects of the present invention.
Figure 4:
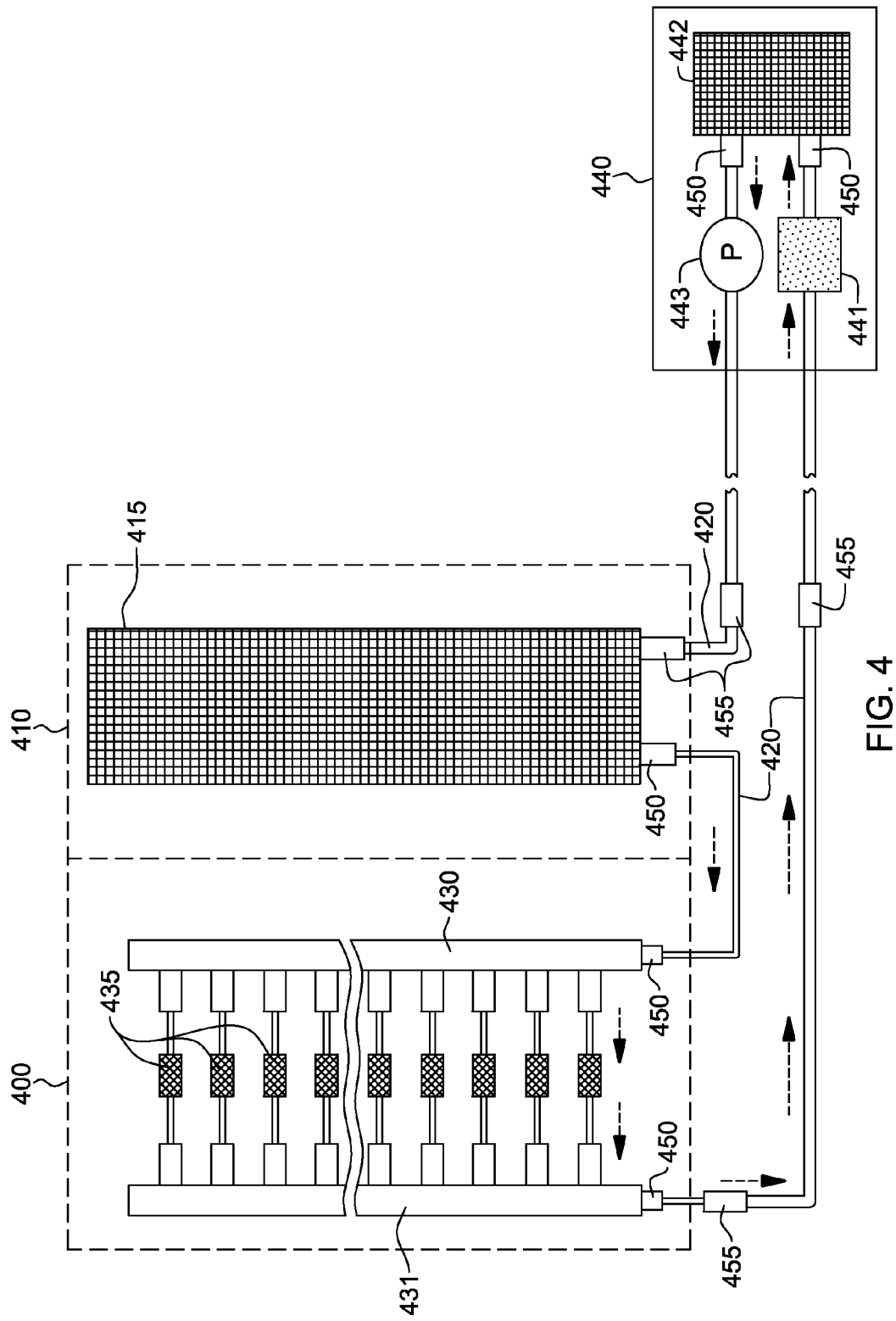
FIG. 4 depicts an alternate embodiment of a cooling system and coolant-cooled electronics system, in accordance with one or more aspects of the present invention.

Due to ever-increasing air flow requirements through electronics racks, and the limits of air distribution within a typical data center installation, liquid-coolant-based cooling is being combined with conventional air-cooling. FIGS. 2-4 illustrate various embodiments of a data center implementation employing such a coolant-based cooling system.

FIG. 2 depicts one rack-level coolant-cooling solution which utilizes (by way of example) chilled facility water to remove heat from the computer installation room, thereby transferring the cooling burden from the air-conditioning unit(s) to the building's chilled water coolers. The embodiment depicted in FIG. 2 is described in detail in commonly assigned, U.S. Pat. No. 6,775,137. Briefly summarized, facility-chilled water 200 circulates through one or more liquid-to-liquid heat exchangers 210, coupled via a system coolant loop 211, to individual electronics racks 220 within the computer room. Rack unit 220 includes one or more air-moving devices 230 for moving air flow from an air inlet side to an air outlet side across one or more drawer units 240 containing heat-generating electronic components to be cooled. In this embodiment, a front cover 250 attached to the rack covers the air inlet side, a back cover 255 attached to the rack covers the air outlet side, and a side car disposed adjacent to (and/or attached to) the rack includes a heat exchanger 260 for cooling air circulating through the rack unit. Further, in this embodiment, the liquid-to-liquid heat exchangers 210 are multiple computer room water-conditioning (CRWC) units which are coupled to receive building chilled facility water 200. The building chilled facility water is used to cool the system coolant within system coolant loop 211, which is circulating through air-to-liquid heat exchanger 260. The rack unit in this example is assumed to comprise a substantially enclosed housing, wherein the same air circulates through the housing that passes across the air-to-liquid heat exchanger 260. In this manner, heat generated within the electronics rack is removed from the enclosed housing via the system coolant loop, and transferred to the facility coolant loop for removal from the computer installation room.

FIG. 3 depicts another embodiment of a rack-level, coolant-cooling solution, which again uses chilled facility water to remove heat from the computer installation room, thereby transferring the cooling burden from the air-conditioning unit(s) to the building's chilled water coolers. In this implementation, one embodiment of a coolant distribution unit 300 for a data center is illustrated. Within coolant distribution unit 300 is a power/control element 312, a reservoir/expansion tank 313, a liquid-to-liquid heat exchanger 314, a pump 315 (often accompanied by a redundant second pump), facility water inlet 316 and outlet 317 supply pipes, a supply manifold 318 supplying water or system coolant to the electronics racks 110 via couplings 320 and lines 322, and a return manifold 319 receiving water or system coolant from the electronics racks 110, via lines 323 and couplings 321. Each electronics rack includes (in one example) a power/control unit 330 for the electronics rack, multiple electronic systems or subsystems 340, a system coolant supply manifold 350, and a system coolant return manifold 360. As shown, each electronics rack 110 is disposed on raised floor 140 of the data center with lines 322 providing system coolant to system coolant supply manifolds 350 and lines 323 facilitating return of system coolant from system coolant return manifolds 360 being disposed in the supply air plenum beneath the raised floor.

In the embodiment illustrated, system coolant supply manifold 350 provides system coolant to cooling apparatuses disposed within the electronic systems or subsystems (for example, to coolant-cooled cold plates or cold rails) via flexible hose connections 351, which are disposed between the supply manifold and the respective electronic systems within the rack. Similarly, system coolant return manifold 360 is coupled to the electronic systems via flexible hose connections 361. Quick connect couplings may be employed at the interface between flexible hoses 351, 361 and the individual electronic systems. By way of example, these quick connect couplings may comprise various types of commercially available quick connect/disconnect couplings.

Although not shown, electronics rack 110 may also include an air-to-coolant heat exchanger, for example, disposed at an air outlet side thereof, which also receives system coolant from the system coolant supply manifold 350 and returns system coolant to the system coolant return manifold 360.

FIG. 4 illustrates another embodiment of a coolant-cooled electronics rack and cooling system therefor, in accordance with one or more aspects of the present invention. In this embodiment, the electronics rack 400 has a side car structure 410 associated therewith or attached thereto, which includes an air-to-coolant heat exchanger 415 through which air circulates from an air outlet side of electronics rack 400 towards an air inlet side of electronics rack 400, for example, in a closed loop path in a manner similar to that illustrated above in connection with the cooling implementation of FIG. 2. In this example, the cooling system comprises an economizer-based, warm-liquid coolant loop 420, which comprises multiple coolant tubes (or lines) connecting, in the example depicted, air-to-coolant heat exchanger 415 in series fluid communication with a coolant supply manifold 430 associated with electronics rack 400, and connecting in series fluid communication, a coolant return manifold 431 associated with electronics rack 400, a cooling unit 440 of the cooling system, and air-to-coolant heat exchanger 415.

As illustrated, coolant flowing through warm-liquid coolant loop 420, after circulating through air-to-coolant heat exchanger 415, flows via coolant supply plenum 430 to one or more electronic systems of electronics rack 400, and in particular, one or more cold plates and/or cold rails 435 associated with the electronic systems, before returning via coolant return manifold 431 to warm-liquid coolant loop 420, and subsequently to a cooling unit 440 disposed (for example) outdoors from the data center. In the embodiment illustrated, cooling unit 440 includes a filter 441 for filtering the circulating coolant, a heat exchanger 442 for removing heat from the coolant, and a pump 443 for returning the coolant through warm-liquid coolant loop 420 to air-to-coolant heat exchanger 415, and subsequently to the coolant-cooled electronics rack 400. By way of example, hose barb fittings 450 and quick disconnect couplings 455 may be employed to facilitate assembly or disassembly of warm-liquid coolant loop 420.

In one example of the warm coolant-cooling approach of FIG. 4, ambient temperature might be 30° C., and coolant temperature 35° C. leaving the air-to-coolant heat exchanger 442 of the cooling unit. The cooled electronic system depicted thus facilitates a chiller-less data center. Advantageously, such a coolant-cooling solution provides highly energy efficient cooling of the electronic system(s) of the electronics rack, using coolant (e.g., water), that is cooled via circulation through the air-to-coolant heat exchanger located outdoors (i.e., a dry cooler) with external ambient air being pumped through the dry cooler. Note that this warm coolant-cooling approach of FIG. 4 is presented by way of example only. In alternate approaches, cold coolant-cooling could be substituted for the cooling unit 440 depicted in FIG. 4. Such cold coolant-cooling might employ building chilled facility coolant to cool the coolant flowing through the coolant-cooled electronics rack, and associated air-to-coolant heat exchanger (if present), in a manner such as described above in connection with FIGS. 2 & 3.

Figure 5B:
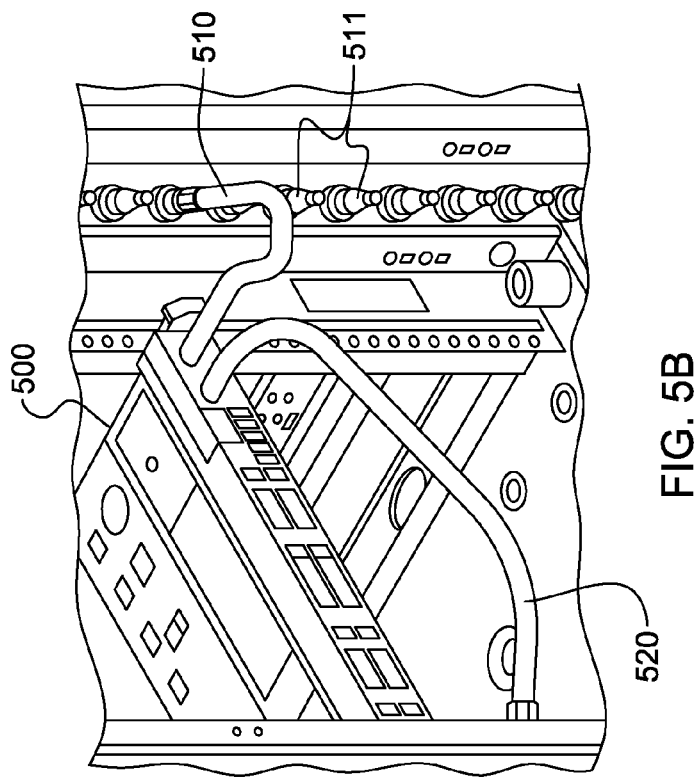
FIG. 5B is a partial depiction of a more detailed embodiment of the rack-level coolant distribution structures illustrated in FIG. 5A, in accordance with one or more aspects of the present invention.
Figure 5A:
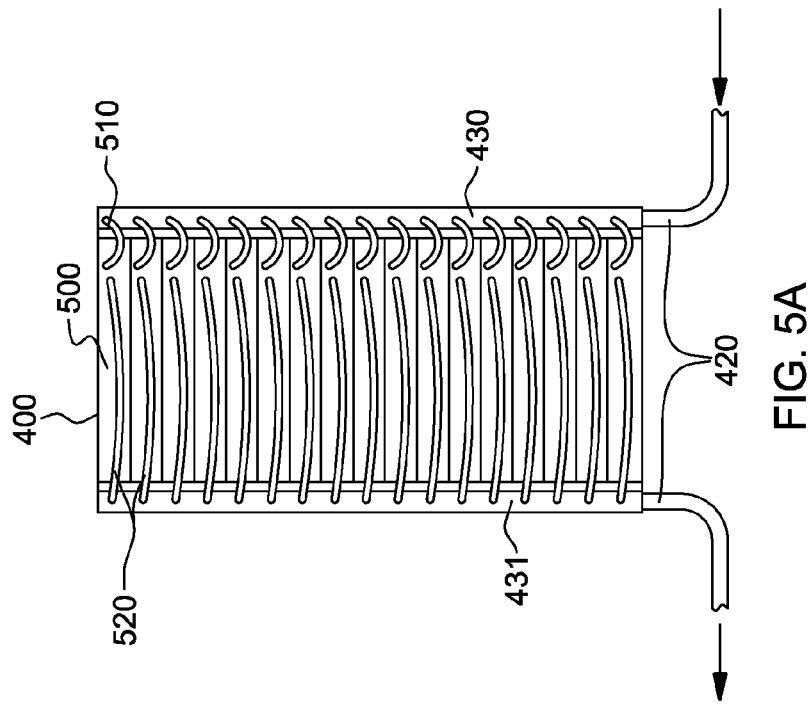
FIG. 5A is a more detailed, elevational view of one embodiment of the coolant-cooled electronics rack of FIG. 4, and illustrating rack-level coolant distribution structures, in accordance with one or more aspects of the present invention.

FIGS. 5A & 5B depict in greater detail one embodiment of a coolant-cooled electronics rack, such as depicted in FIG. 4, in accordance with one or more aspects of the present invention. In this implementation, coolant-cooled electronics rack 400 comprises a plurality of electronic systems 500, within which one or more electronic components are to be coolant-cooled via, for example, one or more cold plates or cold rails, as described below. The cooling system includes coolant loop 420 coupled in fluid communication with coolant supply manifold 430 and coolant return manifold 431, both of which may comprise vertically-oriented manifolds attached to coolant-cooled electronics rack 400. In this embodiment, the rack-level coolant distribution system further includes individual node-level supply hoses 510 supplying coolant from coolant supply manifold 430 to cold plates and cold rails within the electronic systems 500. As shown in FIG. 5B, coolant supply manifold 430 may be (in one embodiment) a vertically-oriented manifold with a plurality of coupling connections 511 disposed along the manifold, one for each electronic system 500 having one or more electronic components to be coolant-cooled. Coolant leaves the individual electronic systems 500 via node-level return hoses 520, which couple the individual electronic systems (or nodes) to coolant return manifold 431, and hence, to coolant loop 420. In the embodiment illustrated in FIG. 4, relatively warm coolant, such as water, is supplied from the cooling unit, either directly, or through one or more air-to-coolant heat exchanger(s) 415 (of FIG. 4), and hot coolant is returned via the coolant return manifold to the cooling unit. In one embodiment of the rack-level coolant distribution system illustrated in FIGS. 5A & 5B, the node-level supply and return hoses 510, 520 are flexible hoses.

Figure 6:
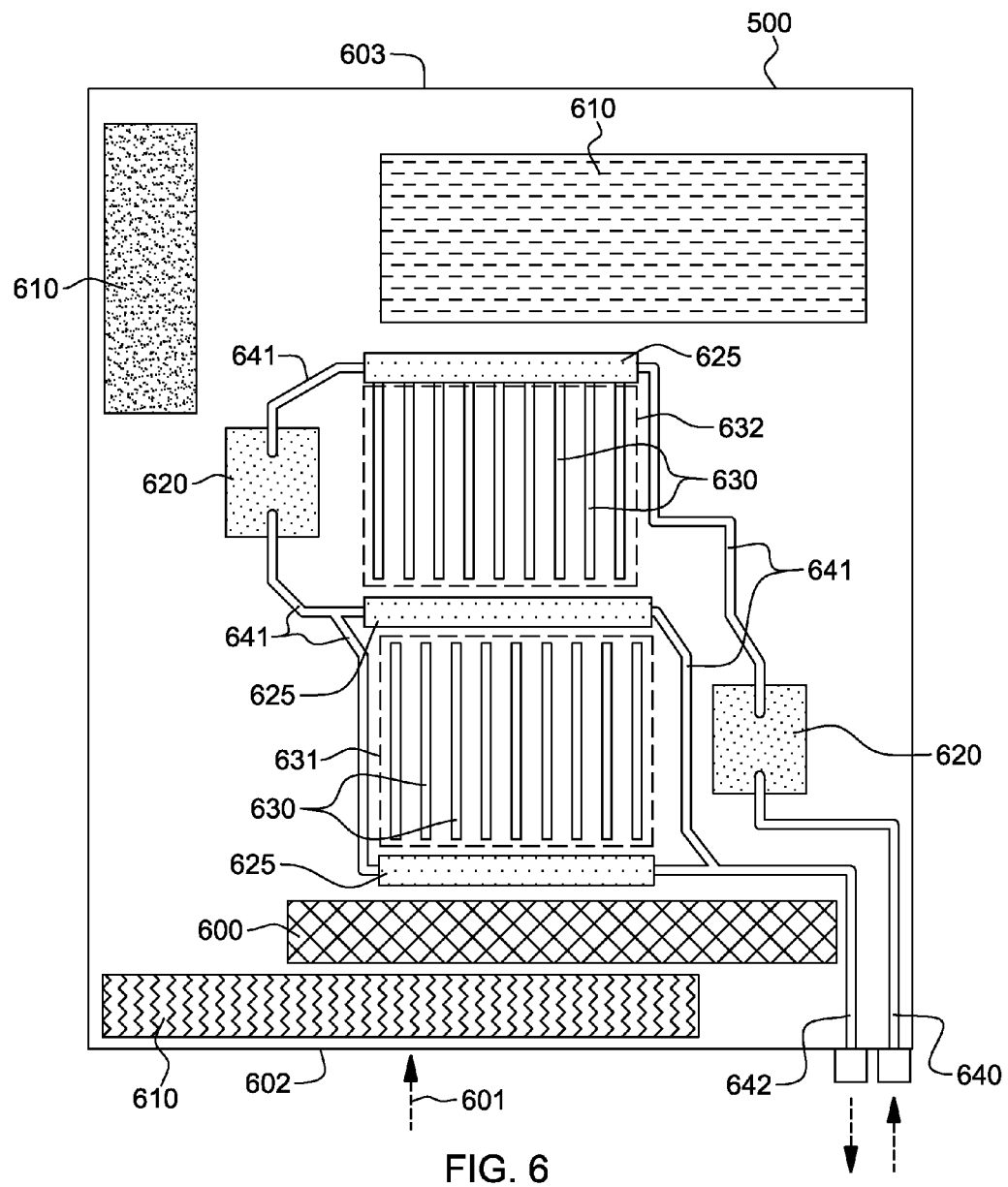
FIG. 6 is a plan view of one embodiment of an electronic system layout for a coolant-cooled electronics rack, and illustrating multiple coolant-cooled cold plates and multiple coolant-cooled cold rails coupled in fluid communication, in accordance with one or more aspects of the present invention.

FIG. 6 illustrates one embodiment of a cooled electronic system 500 component layout, wherein one or more air-moving devices 600 provide forced air flow 601 to cool multiple components 610 within electronic system 500. Cool air is taken in through a front 602 and exhausted out a back 603 of the electronic system (or drawer). The multiple components to be cooled include, for example, multiple processor modules to which coolant-cooled cold plates 620 (of the coolant-based cooling apparatus) are coupled, as well as multiple arrays 631, 632 of electronics cards 630 (e.g., memory modules such as dual in-line memory modules (DIMMs)), which are to be thermally coupled to one or more coolant-cooled cold rails 625. As used herein "thermally coupled" refers to a physical thermal transport path being established between components, for example, between an electronics card and a coolant-cooled cold rail for the conduction of heat from one to the other.

The illustrated coolant-based cooling approach further includes multiple coolant-carrying tubes connecting in fluid communication coolant-cooled cold plates 620 and coolant-cooled cold rails 625. These coolant-carrying tubes comprise (for example), a coolant supply tube 640, multiple bridge tubes 641, and a coolant return tube 642. In the embodiment illustrated, bridge tubes 641 connect one coolant-cooled cold rail 625 in series between the two coolant-cooled cold plates 620, and connect in parallel two additional coolant-cooled cold rails 625 between the second coolant-cooled cold plate 620 and the coolant return tube 642. Note that this configuration is provided by way of example only. The concepts disclosed herein may be readily adapted to use with various configurations of cooled electronic system layouts. Note also, that as depicted herein, the coolant-cooled cold rails are elongate, thermally conductive structures comprising one or more channels through which liquid coolant passes, for example, via one or more tubes extending through the structures. The coolant-cooled cold rails are disposed, in the embodiment illustrated, at the ends of the two arrays (or banks) 631, 632 of electronics cards 630, and multiple thermal spreaders are provided coupling in thermal communication electronics cards 630 and coolant-cooled cold rails 625.

Figure 7:
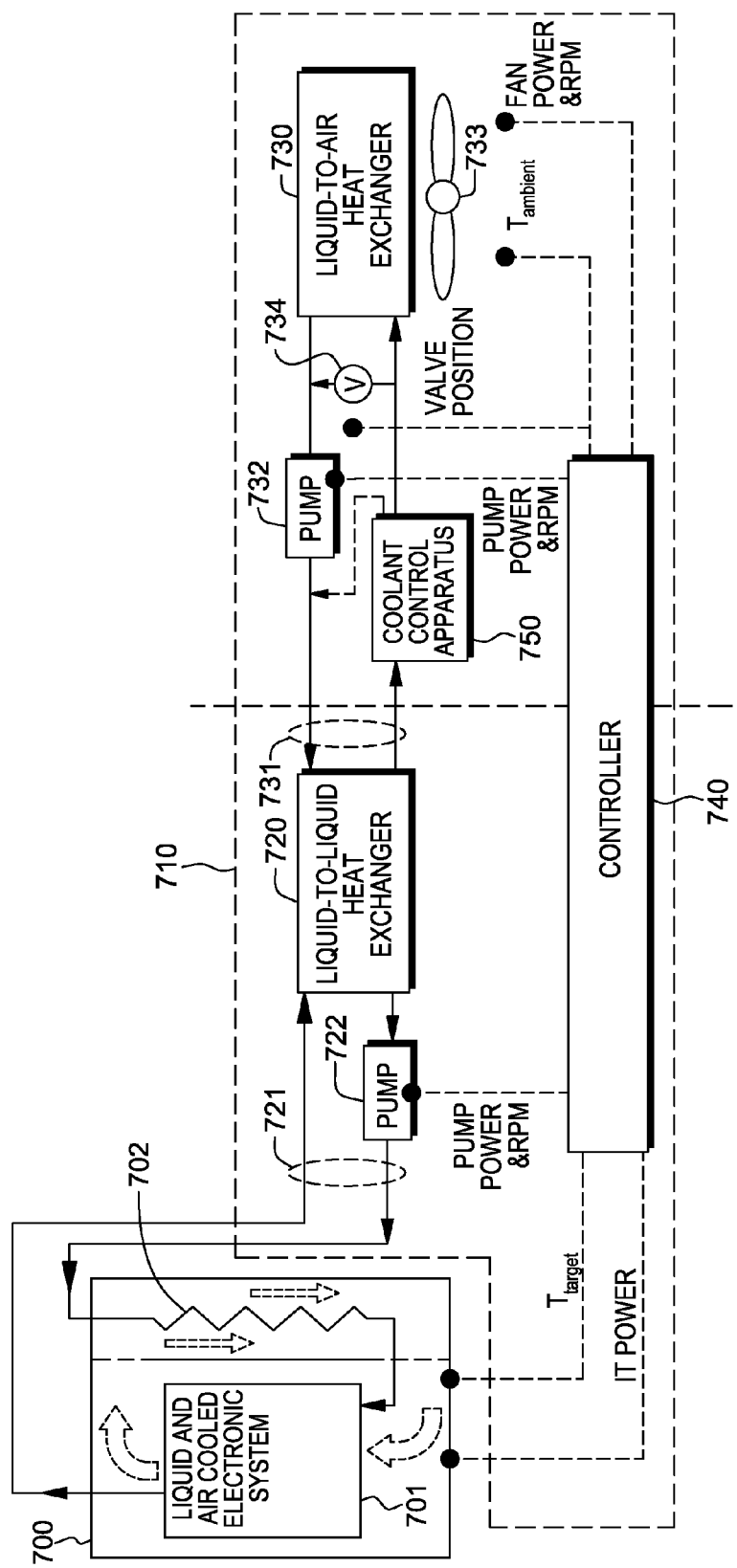
FIG. 7 is a schematic of another embodiment of a cooling system cooling one or more electronic components, systems, or racks of a data center, and including multi-fluid cooling and an automated coolant control apparatus responding to seasonal temperature changes, in accordance with one or more aspects of the present invention.

FIG. 7 depicts an example of a cooled electronic system comprising a controller (or control system) implementing, in one aspect, power consumption cooling control. Note that as used herein, a controller or control system may comprise, by way of example, a computer or a programmable logic controller. The control system may include, for instance, a processor (e.g., a central processing unit), a memory (e.g., main memory), and multiple input/output (I/O) connections, interfaces, devices, etc., coupled together via one or more buses and/or other connections. In one application, the controller or control system couples to a plurality of sensors, such as temperature, pressure, and position sensors, as well as to one or more actuators for controlling, for instance, coolant pump speed, fan speed, or position of one or more recirculation valves to minimize cooling power consumption. Note that the input/output sense and control arrangements may be integrated within the controller or control system, or they may be external I/O modules or devices coupled to the controller which facilitate the desired sensing and actuation functions.

The cooled electronic system depicted in FIG. 7 includes an electronic system (or rack) 700, which comprises by way of example, a liquid and air-cooled electronic system or rack 701 and an air-to-liquid heat exchanger 702. The cooled electronic system further includes a cooling system 710 providing, for example, liquid coolant via a first coolant loop 721 to electronic system (or rack) 700. Electronic system 700 may include, for example, one or more coolant-cooled structures and/or one or more air-to-coolant heat exchangers, such as described above in connection with FIGS. 2-6.

In the depicted embodiment, cooling system 710 includes a liquid-to-liquid heat exchanger 720 and a liquid-to-air heat exchanger 730. First coolant loop 721 couples in fluid communication with liquid-to-liquid heat exchanger 720, as does a second coolant loop 731, connecting liquid-to-liquid heat exchanger 720 to liquid-to-air heat exchanger 730. In this embodiment, a first coolant pump 722 pumps coolant through first coolant loop 721, and a second coolant pump 732 pumps coolant through second coolant loop 731. In addition, an air-moving device, such as a fan 733, facilitates air movement across liquid-to-air heat exchanger 730, and a recirculation valve 734 is provided, which may be a controllable valve with multiple valve settings between an open position and a closed position. A controller 740, such as a programmable logic controller or a computer, implements (in one embodiment) the control system processing described herein. Controller 740 is coupled to control, for instance, one or more of first coolant pump 722, second coolant pump 732, fan 733 and recirculation valve 734. In operation, controller 740 senses or receives the power and/or speed (or revolutions per minute (RPMs)) of first coolant pump 722, second coolant pump 732, and fan 733. Controller 740 further senses a targeted or control temperature ($T_{target}$) associated with, for example, the electronic system or electronics rack, as well as power consumed by the electronic system (e.g., IT power).

As illustrated, the cooled electronic system of FIG. 7 further includes, in one embodiment, an automated coolant control apparatus 750. As explained below, automated coolant control apparatus 750 automatically varies a multi-fluid coolant mixture within (for example) second coolant loop 731, which resides (in one embodiment) at least partially outdoors. This automated control of the fluid mixture within, for instance, second coolant loop 731 may be based on at least one of historical, current, or anticipated outdoor ambient air temperature(s) for a given time period, such as a given season of year. In one implementation, the automated coolant control apparatus automatically provides freeze protection to the second coolant loop 731 with seasonal changes in outdoor ambient temperature, while still considering, enhancing or optimizing heat transfer characteristics of the fluid mixture within the coolant loop. Note that, in this regard, it is assumed that the coolant within the coolant loop, depending on the time of year, possibly, is a fluid mixture of at least two soluble fluids, referred to below as a first fluid and a second fluid, with one specific example being propylene-glycol as the first fluid, and water as the second fluid.

In a typical data center such as described above in connection with FIGS. 1A & 1B, the electronic systems might consume about 50% of the total energy used within the data center, with cooling energy consumption associated with the data center being about 25%. Consequently, reducing power consumed in cooling a data center would be advantageous. In terms of cooling energy consumption, about one-half of the consumed power is by the refrigeration chiller compressor, and about one-third is by the computer room air-conditioning units circulating cooled air, making these two components major contributors to data center energy consumption. In the embodiment of FIG. 7, a "chiller-less" cooling system is depicted, wherein the dissipated heat is rejected to outdoor air, while still allowing for liquid cooling within the data center. The anticipated benefits of this approach include a significant energy savings at the data center level due to a significant reduction in cooling energy consumed, that is, compared with a conventional refrigeration-based cooling facility such as depicted in FIG. 1B.

In the approach of FIG. 7, there are primary and secondary coolant loops, with (for instance) water being circulated through the primary loop within the data center to transport heat from, for example, one or more electronics racks to the liquid-to-liquid heat exchanger 720. Heat transferred to the coolant in the secondary coolant loop is then rejected via liquid-to-air heat exchanger 730 to the outside air. In warm weather months, both loops may utilize water as the cooling fluid to take advantage of its excellent heat transfer and transport properties. However, in winter months, and depending on the location of the cooling system, the possibility of outdoor ambient air temperature falling below freezing may exist. In such a case, an antifreeze fluid, for instance, propylene-glycol, may need to be added to the secondary coolant loop to prevent freeze damage. (Note that, in this example, at least a part of the secondary coolant loop is assumed to be exposed to outdoor ambient air temperature.) The lower thermal conductivity of the antifreeze fluid, however, makes it less effective as a heat transfer fluid than water. So, to achieve the same heat transfer performance as water alone in the secondary loop, the coolant flow rate of a water-antifreeze mixture might be increased. In addition, the antifreeze fluid has a higher viscosity, which results in increased pressure drop compared with water only at the same flow rate. The higher flow rate required with a water-antifreeze mixture, plus the increased pressure drop due to the higher viscosity of the water-antifreeze mixture, have a compounding effect increasing the power consumed in performing the cooling function.

The increased flow requirement, and therefore the increased cooling power consumption, for a water-antifreeze mixture, is somewhat mitigated by the lower outdoor temperatures. With a lower sink temperature, a higher thermal resistance can be tolerated at the same component power and temperature, thereby allowing a lower secondary loop flow rate. However, as the days progress from winter to spring to summer, with a water-antifreeze mixture in the secondary coolant loop, the warmer outdoor temperatures necessitate a higher secondary loop flow rate, and as a result, increase cooling power consumption. Therefore, an automated mechanism for, for instance, selectively increasing or decreasing the concentration of antifreeze in the secondary coolant loop, as the outdoor temperature(s) seasonally varies from non-freezing to freezing to sub-freezing levels and back, is desirable. Disclosed hereinbelow is an automated coolant control apparatus for accomplishing this control in a programmable or dynamic manner in response to seasonal changes or outdoor ambient air temperature changes.

Generally stated, disclosed herein is a cooling system, cooled electronic system, and method, which automatically control concentration level of a first fluid (such as antifreeze fluid) in the coolant within a coolant loop, based on at least one of historical, current, or anticipated outdoor ambient temperature(s) for a period of time. The cooling system includes a coolant loop which is configured to facilitate cooling of an electronic component or system. As one example, the coolant loop may comprise secondary coolant loop 731 in the cooled electronic system implementation of FIG. 7. As noted, at least a portion of the coolant loop may reside outdoors or otherwise be exposed to outdoor ambient air temperature (e.g., resides in an unheated structure), and thus, the coolant loop is susceptible to variations in outdoor ambient air temperature(s). The cooling system includes at least one coolant tank, which includes a first reservoir containing at least partially a first fluid, and a second reservoir containing at least partially a second fluid. The first fluid (e.g., antifreeze) freezes at a lower temperature than the second fluid (e.g., water). Further, the second fluid has superior cooling properties compared with the first fluid, and the first fluid and the second fluid are soluble fluids, that is, the first fluid and the second fluid form a solution when mixed. The cooling system further includes multiple valves for selectively coupling at least one of the first fluid in the first reservoir, or the second fluid in the second reservoir, into the coolant loop. The multiple valves, which may comprise solenoid valves, may be independently controllable. A controller automatically controls the multiple valves to vary the concentration level of the first fluid in the coolant within the coolant loop based on at least one of historical, current, or anticipated outdoor ambient air temperature(s) for a given or upcoming time of year, based on location of the cooling system.

Depending on the historical, current, or anticipated outdoor ambient air temperature(s), the controller automatically controls one or more of the multiple valves to increase the concentration level of the first fluid in the coolant loop by diverting at least a portion of the coolant within the coolant loop into the first reservoir, while directing, for instance, an equal amount of first fluid in the first reservoir into the coolant loop, wherein the coolant in the coolant loop includes at least the second fluid. The controller further initiates fractional distillation of coolant within the first reservoir to facilitate separating of the first fluid into the first reservoir and the second fluid into the second reservoir. The fractional distillation process results in boiling of the second fluid in the first reservoir, wherein the second fluid vapor rises within the first reservoir, and passes via a vapor passageway between the first reservoir and the second reservoir into the second reservoir, leaving a higher concentration of the first fluid in the first reservoir. In one implementation, the first reservoir further includes a first fluid vapor condenser for condensing any first fluid vapor within the first reservoir resulting from the fractional distillation of the coolant. By way of example, the first fluid may condense at a higher temperature than the second fluid, and the second fluid vapor thus passes through the first fluid vapor condenser in the first reservoir and through the vapor passageway between the first reservoir and the second reservoir, into the second reservoir. The cooling system further includes a second fluid vapor condenser disposed within the second reservoir to facilitate condensing the second fluid vapor within the second reservoir.

In another aspect, the controller may automatically control one or more of the multiple valves to decrease the concentration level of the first fluid in the coolant loop based on at least one of historical, current, or anticipated outdoor ambient air temperature(s) for a given or upcoming time of year. The valves can be automatically controlled to decrease the concentration level of the first fluid in the coolant by diverting at least a portion of the coolant within the coolant loop into the first reservoir of the at least one coolant tank while directing, for instance, an equal amount of second fluid in the second reservoir into the coolant loop. In combination with this process, the above-noted fractional distillation of fluid in the first reservoir is employed to facilitate separating the first fluid into the first reservoir and the second fluid into the second reservoir. Fractional distillation may be employed, for example, after a desired concentration of the first fluid (or the second fluid) in the coolant within the coolant loop has been reached.

As a specific example, based upon a pre-programmed schedule, a first fluid (e.g., a glycol) concentration sensor may be used to sense the concentration of the first fluid in the coolant loop, and to determine if the concentration level is adequate to prevent freezing for expected minimum seasonal outdoor temperatures for an upcoming time of year (based on the location of the cooling system). If "no", then a fraction of the coolant flow may be diverted into the first fluid reservoir of the coolant tank containing the higher concentration of the glycol fluid. As coolant is diverted into the glycol reservoir of the coolant tank, glycol is allowed to leave the tank and enter the coolant loop, until the glycol concentration is raised to the desired concentration level. If it is determined that the glycol level is higher than desired to prevent freezing for a given seasonal period, then a fraction of the coolant flow may again be diverted into the glycol fluid reservoir of the coolant tank, with a corresponding amount of the second fluid in the second fluid reservoir allowed to leave the second reservoir of the coolant tank to replace the coolant mixture diverted into the first fluid reservoir of the coolant tank, that is, until the first fluid concentration is reduced to the desired concentration level. After either the first fluid is added, or the second fluid is added (with a concomitant first-second fluid mixture removal), a fractional distillation cycle is employed to separate the second fluid from the first fluid and to await the next automated seasonal change in the first fluid concentration level within the coolant loop.

Figure 8A:
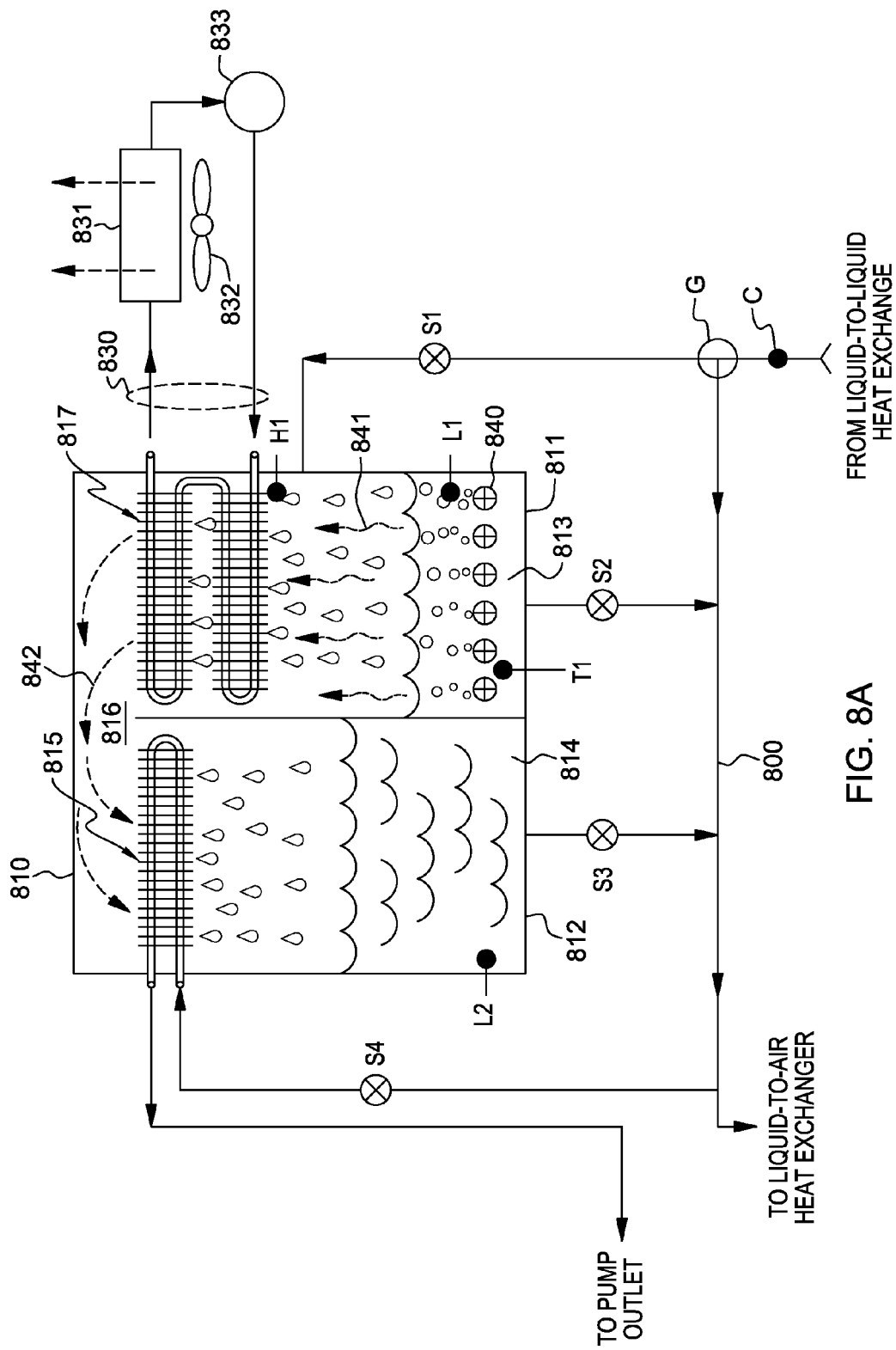
FIG. 8A depicts one embodiment of an automated coolant control apparatus for a cooling system such as depicted in FIG. 7, in accordance with one or more aspects of the present invention.
Figure 8B:
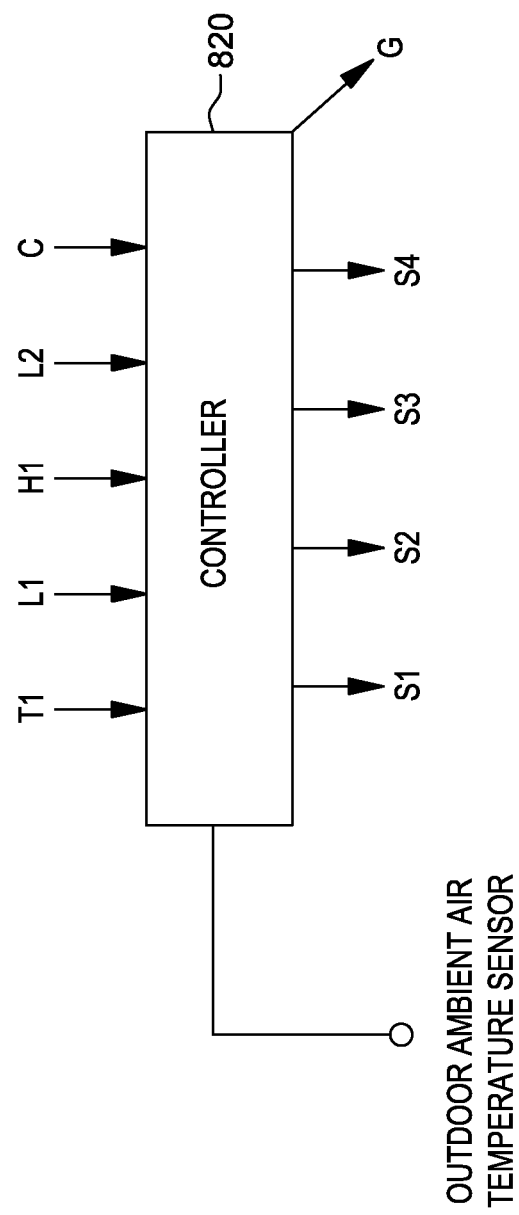
FIG. 8B depicts one embodiment of a controller of the automated coolant control apparatus of FIG. 8A, in accordance with one or more aspects of the present invention.

FIGS. 8A & 8B depict one embodiment of an automated coolant control apparatus, in accordance with one or more aspects of the present invention. Referring collectively to FIGS. 8A & 8B, the cooling system includes a coolant loop 800, only a portion of which is illustrated in FIG. 8A, and one or more coolant tanks 810. As noted above, it is anticipated that at least a portion of coolant loop 800 is to be exposed to outdoor ambient air temperature, and thus be susceptible to freezing. In one example, coolant loop 800 may be a secondary coolant loop, such as secondary coolant loop 731 in the cooled electronic system embodiment of FIG. 7, described above.

As illustrated in FIG. 8A, the cooling system includes, for instance, a first fluid concentration sensor 'C' disposed to sense concentration of the first fluid within coolant loop 800. In one example, the first fluid is a glycol-based fluid, and the glycol concentration sensor may comprise a sensor such as described in U.S. Pat. No. 6,170,318, Japanese Patent Publication Nos. JP2002295848, or JP2007247506, or PCT Publication Nos. WO 2012/010736, or WO 2003/056304, as well as other art available in the literature. The cooling system further includes a coolant flow-diverter valve 'G' (such as a 3-way valve) in the coolant loop to selectively divert a portion of the coolant in the coolant loop into coolant tank 810, and in particular, into a first reservoir 811 of coolant tank 810. As illustrated, coolant tank 810 further includes a second reservoir 812, and the first and second reservoirs are coupled via a passageway or opening 816 in the upper regions thereof. In one embodiment, to start with, first reservoir 811 principally includes a first fluid 813, and second reservoir 812 principally includes a second fluid 814. By way of specific example, first fluid 813 may be a glycol-based fluid such as propylene-glycol, and second fluid 814 may be water. The first and second fluids are soluble fluids, the first fluid freezes at a lower temperature than the second fluid, and the second fluid has superior cooling properties compared with the first fluid. Low-level liquid sensors L1, L2 are provided, in one example, in the respective first and second reservoirs 811, 812 of coolant tank 810. In addition, a high-level sensor H1 is provided (in one implementation) within first reservoir 811. A temperature sensor T1 may be also provided to sense temperature of first fluid 813 within first reservoir 811, and employed as described below.

The cooling system further includes multiple electronically-controlled valves S1, S2, S3, & S4, which may be controlled by a controller 820 (see FIG. 8B) to automatically control (in combination with flow-diverter valve 'G') diverting of a portion of the coolant within coolant loop 800 into coolant tank 810, and in particular, into first reservoir 811 of coolant tank 810, and in the case of valve S4, for diverting a small portion of the coolant within coolant loop 800 through a second fluid vapor condenser 815 disposed within the upper region of second reservoir 812. Valves S1, S2, S3, & S4 are, in one embodiment, independently controlled by controller 820, and controller 820 may be programmed to automatically control the valves to vary, for example, a concentration level of the first fluid in the coolant mixture within coolant loop 800 based on at least one of historical, current, or anticipated outdoor ambient air temperature(s) for a current or upcoming time of year.

As noted, fractional distillation is selectively initiated by the controller to concentrate first fluid 813 within first reservoir 811, and second fluid 814 within second reservoir 812. In one implementation, concentration levels of the first fluid (e.g., glycol) within the coolant mixture flowing through coolant loop 800 may be automatically seasonally changed, and with each seasonal change, fractional distillation may occur to again separate the fluids in their respective reservoirs. This fractional distillation process may employ electric heaters 840 disposed within first reservoir 811 to controllably boil the fluid mixture within first reservoir 811, causing second fluid vapor and (possibly) first fluid vapor 841 to rise within the first reservoir 811. A first fluid vapor condenser 817 is disposed in an upper region of first reservoir 811 to condense any first fluid vapor rising from the boiling process. In one implementation, the first fluid vapor condenses at a higher temperature than the second fluid vapor, and thus, first fluid vapor condenser 817 may be configured with a supplemental or condenser coolant flowing therethrough which facilitates condensing of the first fluid within the first reservoir, while allowing the second fluid vapor 842 to pass via the one or more vapor passageways 816 into second reservoir 812, where it is condensed by second fluid vapor condenser 815. Coolant is provided to first fluid vapor condenser 817 via a supplemental or condensing coolant loop 830, which may include a liquid-to-air heat exchanger 831 with a fan 832, as well as a coolant pump 833. When operational, coolant within supplemental coolant loop 830 is circulated through condenser 817, and heat is rejected from the supplemental coolant via the liquid-to-air heat exchanger 831 to, for instance, ambient airflow across the heat exchanger, augmented by controllable fan 832.

As illustrated in FIG. 8B, in one embodiment, controller 820 receives as inputs readings from sensors T1, L1, H1, L2, C, as well as outdoor ambient air temperature, and automatically controls electronically controllable valves S1, S2, S3, S4 & G, for example, in a manner such as described herein. Controller 820 may be either within the automated coolant control apparatus, or disposed remote from the control apparatus, for instance, combined with a controller such as the controller controlling the processes of a cooled electronic system, such as depicted in FIG. 7.

Figure 9:
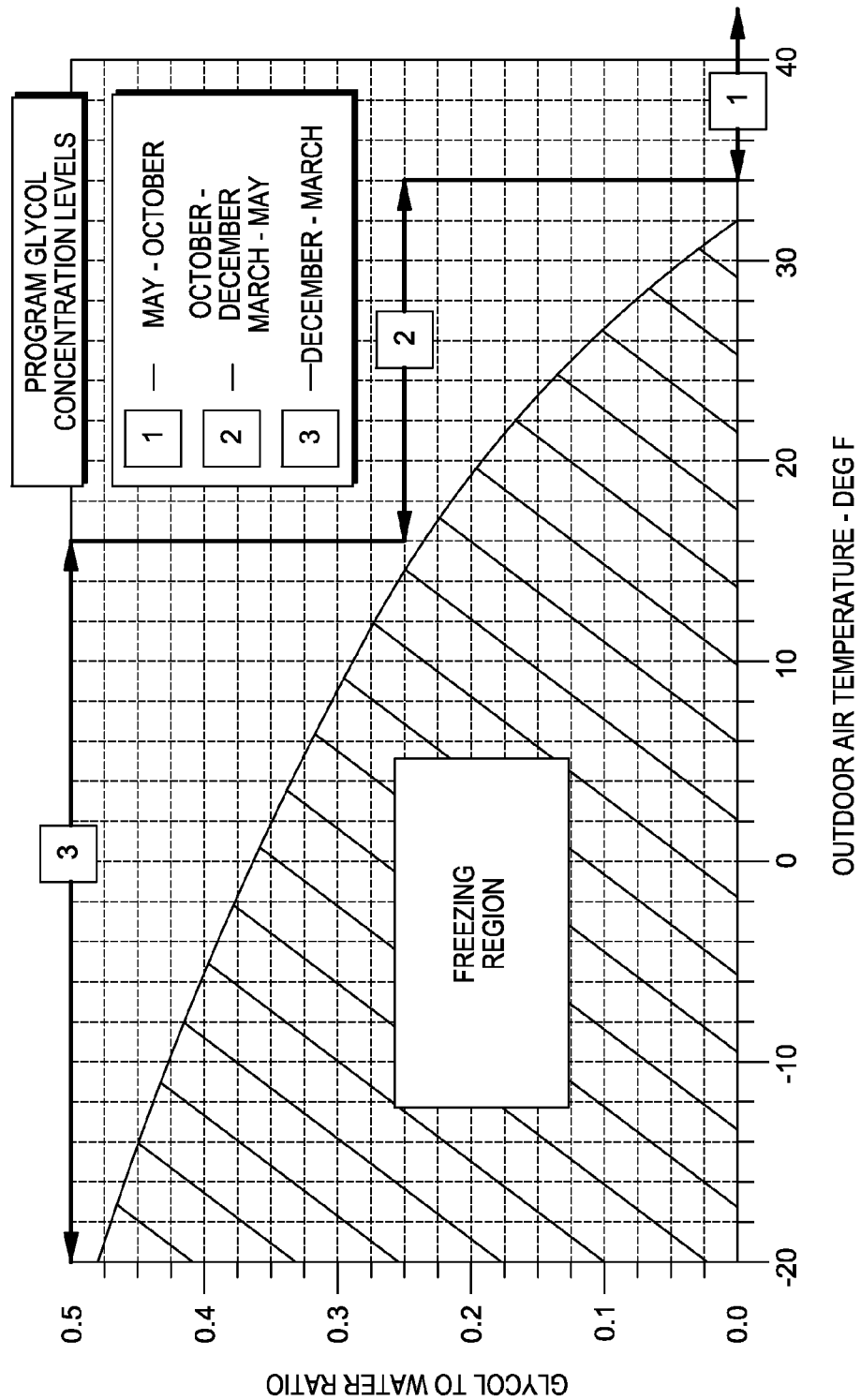
FIG. 9 graphically represents automated varying of concentration levels of first and second fluids of a multi-fluid coolant in a cooling system such as depicted in FIGS. 7-8B, in accordance with one or more aspects of the present invention.

FIG. 9 illustrates one embodiment of an automated, seasonal change in glycol concentration level in a coolant of a coolant loop based on seasonal temperature changes. With each adjustment, fractional distillation may be employed to separate the first and second fluids into the respective first and second reservoirs of the coolant tank, in a manner such as described herein. As illustrated in FIG. 9, the glycol concentration level is selected to ensure that the glycol-to-water ratio remains above the freezing region, based on anticipated outdoor ambient air temperatures for the different seasons at the given location of the cooling system.

By way of specific example, assume again that the first fluid comprises propylene-glycol, the second fluid water, and that for instance, there is a 40 gallon coolant capacity in the coolant loop. Further, assume that the maximum desired fraction of propylene-glycol in the loop for the coldest portion of the year is 50%. By way of example, it is assumed that the quantity of propylene-glycol stored in reservoir 1 of the coolant tank is 25 gallons, with an equal quantity of water stored in reservoir 2 of the tank. During a warm weather season (e.g., May through October), the fraction of propylene-glycol in the coolant loop will be at a minimum level for minimum impact on heat transfer effectiveness.

At the end of the warm weather season, it may be desirable to protect the water in the coolant loop from freezing down to a temperature of, for instance, 15° F. To do this, the fraction of propylene-glycol in the loop is increased to, for instance, 25%, as illustrated in FIG. 9. Based upon the time of year, the controller initiates action to accomplish this. Solenoid-actuated valves S1 and S2 (see FIGS. 8A & 8B) are opened by the controller and motorized flow-diverter valve 'G' is partially opened, allowing a portion of the coolant flow in the coolant loop to pass through valve S1 into the first reservoir of the coolant tank, and in one embodiment, an equal portion of fluid in the first reservoir (which has the higher concentration of propylene-glycol) to exit through valve S2 into the coolant loop. A portion of the coolant continues to flow into and out of the first reservoir of the coolant tank until the signal received from the first fluid concentration sensor 'C' indicates that the coolant circulating in the loop is at the desired propylene-glycol concentration (in the example of FIG. 9, 25% propylene-glycol and 75% water). At this point, solenoid valves S1 and S2 are closed, and the flow-diverter valve 'G' is returned to its closed position.

After the desired propylene-glycol concentration level has been attained in the coolant loop, fractional distillation is employed to automatically separate the water and propylene-glycol mixture in the first reservoir, so that the propylene-glycol portion remains in the first reservoir, and the water portion is transferred to the second reservoir. The pump 833 for the propylene-glycol condensation loop, that is, the supplemental or condensing coolant loop 830 depicted in FIG. 8A, is turned on, circulating cooling liquid through the propylene-glycol condenser 817 (FIG. 8A) in the upper portion of the first reservoir. In addition, the heaters in the lower portion of the first reservoir are powered on, causing the temperature of the propylene-glycol-water mixture in the first reservoir to rise, with eventual pool-boiling off the heater surfaces. The evolving vapors will comprise both propylene-glycol vapor and water vapor, but predominately water vapor, since water boils at a lower temperature than propylene-glycol. The coolant circulating through the propylene-glycol condenser is maintained at a temperature low enough to condense any propylene-glycol vapors that may evolve, but too high to condense the evolving water vapor. The temperature of the circulating condensing coolant may be controlled by sensing its temperature, and turning the fan supplying airflow across the air-to-liquid heat exchanger on and off as needed. The evolving propylene-glycol vapor is condensed and returned to the lower portion of the first reservoir.

The water vapors will be transported from the first reservoir of the coolant tank to the second reservoir, and in particular, across the water vapor condenser disposed within the second reservoir. Upon contact with this condenser, the water vapors are condensed into liquid water, and then stored in the second reservoir for eventual reuse. During the distillation cycle, solenoid valve S4 is open, allowing a small fraction of the coolant flow in the coolant loop to pass through the water-vapor heat exchanger at the upper portion of the second reservoir to keep the water vapor condenser surfaces well below the temperature of the saturated water vapor. As the water is boiled off in the first reservoir, the temperature of the pool of liquid in the lower region of the first reservoir will approach the boiling point temperature of pure propylene-glycol. The pool temperature in the first reservoir is monitored by sensor T1 in the lower region of the reservoir, and the heaters are powered down as the saturation temperature of pure propylene-glycol is reached. The propylene-glycol condensation loop pump and fan are then powered down, and solenoid valve S4 is closed. A low-liquid level sensor L1 is provided in the first reservoir to ensure that the heaters are always immersed, and if not, the heaters are powered down.

At a later point in the year, for example, December, it may be desirable to further protect the water in the coolant loop from freezing, for instance, down to an even lower temperature, such as −20° F. To do this, the fraction of propylene-glycol in the loop is automatically increased to, for instance, close to 50%, as illustrated in FIG. 9. Based upon the time of year, the controller will initiate action to accomplish this. Solenoid-actuated valves S1 and S2 are opened, and motorized flow-diverter valve 'G' is partially opened to allow for a portion of the coolant flow in the coolant loop to pass through valve S1 into the first reservoir of the tank and, for instance, an equal portion of propylene-glycol to exit through valve S2 from the tank into the coolant loop. A portion of coolant continues to flow into the first reservoir of the tank until the signal received from the propylene-glycol concentration sensor 'C' indicates that the coolant circulating in the coolant loop is at the desired propylene-glycol concentration (e.g., 50% propylene-glycol and 50% water). At this point, solenoid valves S1 & S2 are closed, and the flow-diverter valve 'G' is returned to its closed position. Once the coolant loop has been brought up to the new propylene-glycol concentration level, the distillation cycle operation described above is initiated.

Following the winter season, it will be desirable to lower the concentration of propylene-glycol in the coolant loop. For instance, in March, the propylene-glycol level in the coolant loop may be reduced to 25% to once again protect the loop from freezing, down to a temperature of, for instance, 15° F. To do this, the solenoid-actuated valve S1 and motorized flow-diverter valve 'G' are partially opened, allowing a portion of the coolant flow in the coolant loop to pass through valve S1 into the first reservoir of the coolant tank. Solenoid valve S3 is also opened, allowing water in the second reservoir to enter the coolant loop. These valves are kept open until any one of three events occur, namely: (1) the propylene-glycol concentration sensor 'C' indicates that the propylene-glycol concentration in the coolant loop has dropped to the desired level; (2) the high-liquid level sensor H1 indicates that the liquid in the first reservoir is at a maximum level; or (3) the low-level sensor L2 in the second reservoir indicates that the water level in the second reservoir is at a minimum level. Following the occurrence of any one of these events, solenoid valves S1 and S3 are closed, and the flow-diverter valve 'G' is returned to its closed position. The fractional distillation (i.e., water-propylene-glycol separation) cycle sequence described above is then repeated. Following completion of the water-propylene-glycol separation cycle, the propylene-glycol concentration sensor is read. If the propylene-glycol concentration is at the desired level, no further action is required, and the coolant loop continues normal operation. If the propylene-glycol concentration level is higher than the prescribed value, then the propylene-glycol withdrawal process described above is repeated, including the fractional distillation cycle, until the desired propylene-glycol concentration is attained.

As summer approaches, for instance, in May in the contiguous U.S., there is no need for any propylene-glycol in the coolant loop. At this time, the above process may be invoked to again reduce propylene-glycol concentration in the coolant loop to a minimal level (e.g., 5% or less), and the coolant loop continues operation at this level until the following October, when it may be desirable to again automatically add propylene-glycol to the coolant loop.

Figure 10A:
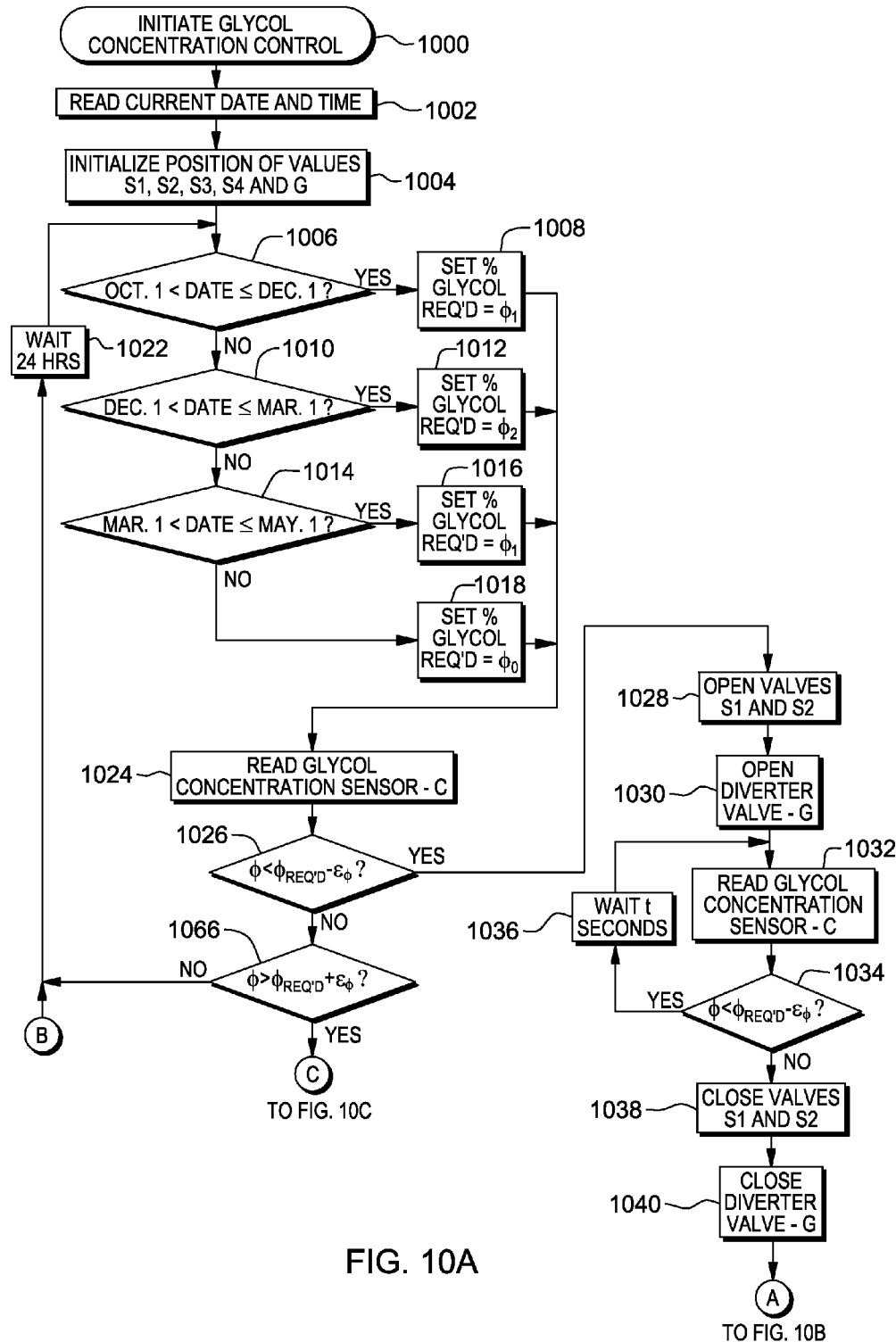
FIGS. 10A-10C depict a flowchart of one embodiment of a process implemented by an automated coolant control apparatus such as depicted in FIGS. 8A & 8B, in accordance with one or more aspects of the present invention.
Figure 10B:
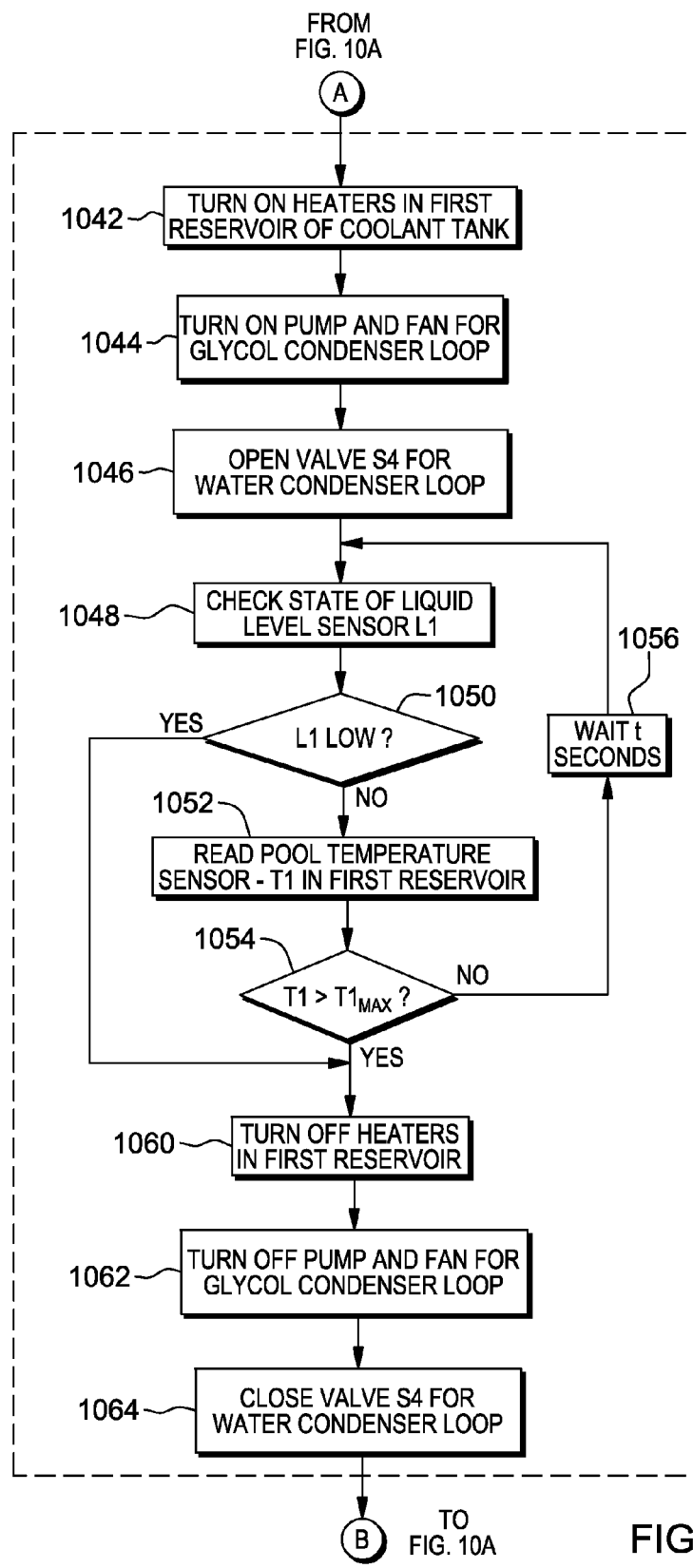
Figure 10C:
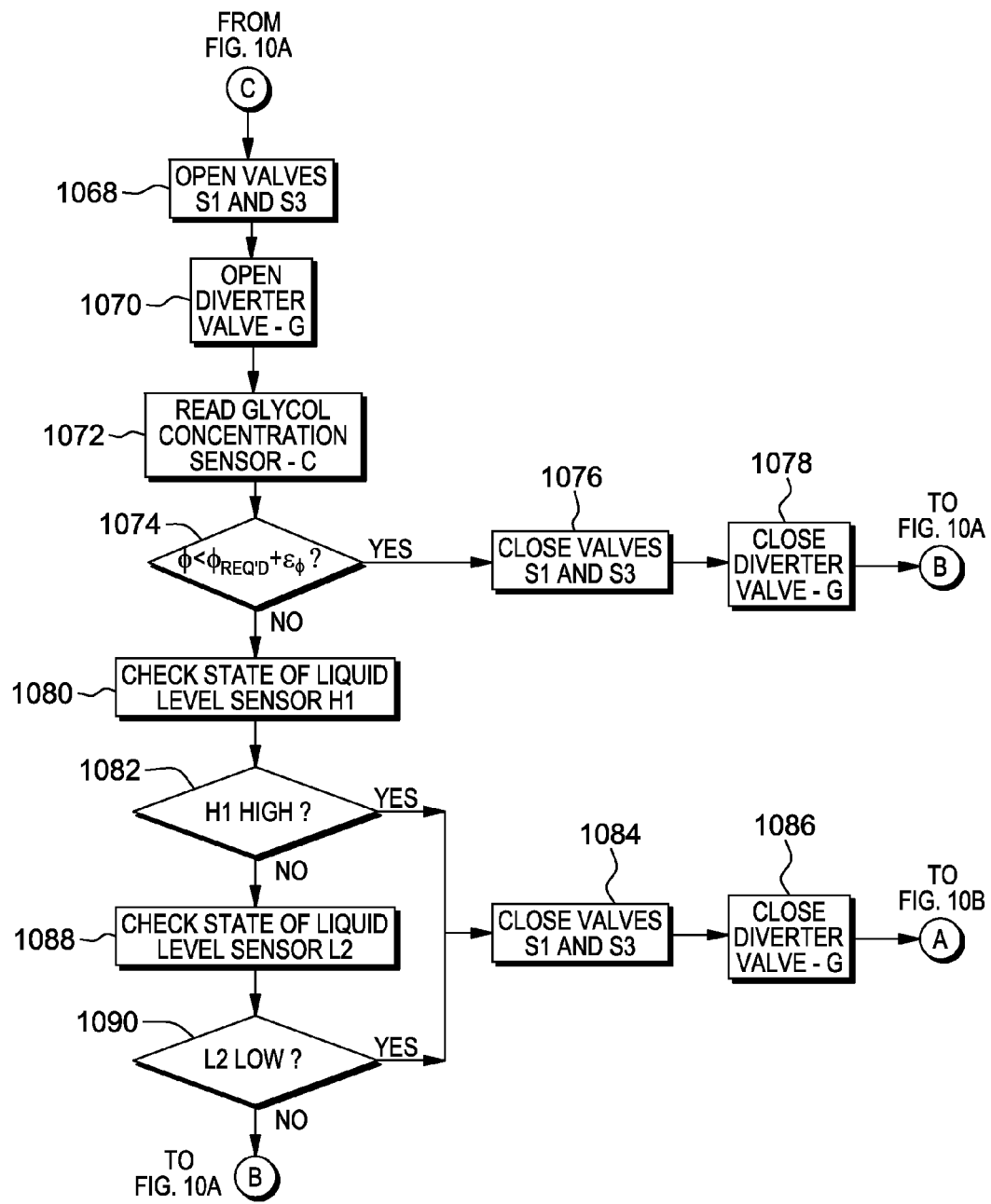

FIGS. 10A-10C depict one detailed embodiment of coolant control processing of a cooling system, in accordance with one or more aspects of the present invention. This detailed process embodiment is presented by way of example only, and those skilled in the art will note that various modifications, substitutions, and/or additions to the process may be made, within departing from the invention as defined by the claims presented herewith. For instance, the dates at which concentration levels of the propylene-glycol are changed may vary depending upon the location of the cooling system. In the example depicted in FIGS. 10A-10C, it is assumed (by way of example only) that the first fluid comprises a glycol-type antifreeze, and the second fluid comprises water.

Upon initiation of glycol concentration control 1000, processing reads the current date and time 1002, and initializes positions of the controllable valves, for instance, S1, S2, S3, S4 and diverter valve 'G' in the above example 1004. Processing then determines whether the date is, for instance, after October $1^{st}$, but on or before December $1^{st}$ 1006, and if "yes", then the percent glycol concentration required is set to $\phi_1$ 1008. Assuming that the date is not within the first range, processing determines whether the date is after December $1^{st}$, but on or before March $1^{st}$ 1010, and if "yes", then the glycol concentration required is set to $\phi_2$ 1012. Assuming that the date is other than in the first or second range, processing determines whether the date is after March $1^{st}$, but on or before May $1^{st}$ 1014, and if "yes", sets the percent glycol required to $\phi_1$ 1016. If the date is outside of the first three ranges, then it must be after May $1^{st}$, but on or before October $1^{st}$, and processing therefore sets the percent glycol concentration required to $\phi_0$ 1018.

After setting the desired glycol percent concentration for the coolant loop, processing reads the glycol concentration sensor 'C' 1024 to determine the current concentration level ($\phi$), and then determines whether the current glycol concentration ($\phi$) is less than the required glycol concentration level set ($\phi_{req'd}$), minus a set, acceptable tolerance ($\epsilon_\phi$) 1026.

Assuming that the current concentration level ($\phi$) is less than the required concentration level less the acceptable tolerance, processing opens valves S1 & S2 1028, and opens diverter valve 'G' 1030, before again reading the glycol concentration sensor 'C' 1032. Processing then determines whether the just-read glycol concentration ($\phi$) is less than the required glycol concentration ($\phi_{req'd}$) minus the tolerance ($\epsilon_\phi$) 1034. If "yes", then processing waits an interval of time 1036, before again reading the glycol concentration sensor 'C' 1032. Once the sensed glycol concentration level ($\phi$) is equal to or greater than the required concentration level ($\phi_{req'd}$) less $\epsilon_0$, processing closes valves S1 & S2 1038, closes diverter valve 'G' 1040, and initiates fractional distillation processing, one embodiment of which is depicted in FIG. 10B.

Referring to FIG. 10B, fractional distillation begins with turning on the heaters in the first reservoir of the coolant tank 1042, and turning on the pump and fan for the first reservoir's glycol condensing loop 1044. Valve S4 for the second reservoir's, water condensing loop 1046 is opened, and processing checks the state of liquid level sensor L1 1048. Processing determines whether liquid level sensor L1 is sensing a low liquid level 1050, and if "no", reads the fluid pool temperature sensor T1 1052, and determines whether temperature sensor T1 is greater than a maximum acceptable sensor $T1_{max}$ 1054. If "no", then processing waits a time interval, such as t seconds 1056, before again checking the liquid level sensor L1 and repeating the process. If the liquid level L1 indicates a low liquid level within the first reservoir, or if the pool temperature is greater than the maximum acceptable temperature, then processing turns the heaters in the first reservoir off 1060, and turns off the pump and fan for the first reservoir's glycol condensation loop 1062, as well as closes valve S4 for the second reservoir's water condensing loop 1064. After terminating fractional distillation, processing waits 24 hours 1022 before again evaluating the date to determine whether a glycol concentration level change is to be made.

Assuming that the read glycol concentration level ($\phi$) is not less than the required concentration level less the set tolerance 1026, then processing determines whether the read glycol concentration level ($\phi$) is greater than the required concentration level ($\phi_{req'd}$) plus the set tolerance ($\epsilon_\phi$) 1066. If "no", then processing waits 24 hours before again evaluating the dates to determine whether a further glycol concentration level change is required. However, if the currently sensed glycol concentration level is greater than the required concentration level plus the tolerance, then processing continues in FIG. 10C, by opening valves S1 & S3 1068, opening diverter valve 'G' 1070, and again reading the glycol concentration sensor 'C' 1072. Processing determines whether the currently read glycol concentration is less than the required glycol concentration plus the tolerance 1074, and if "yes", closes valves S1 and S3 1076, and closes diverter valve 'G' 1078, before waiting 24 hours 1022 and repeating the process.

Assuming that the currently read glycol concentration level ($\phi$) is not less than the required concentration level ($\phi_{req'd}$)

plus the tolerance ($\epsilon_\phi$), then the state of the liquid level sensor H1 in the first reservoir of the coolant tank is checked 1080, and processing determines whether the coolant level in the first reservoir is high 1082. If "no", then processing checks the state of the liquid level sensor L2 in the second reservoir of the coolant tank 1088, and determines whether the coolant level in the second reservoir is low 1090. If neither is true, processing waits 24 hours before repeating the process. However, if the fluid level in the first reservoir is too high, or the fluid level in the second reservoir is too low, then processing closes valves S1 & S3 1084, and closes diverter valve 'G' 1086, before performing the fractional distillation process depicted in FIG. 10B.

As will be appreciated by one skilled in the art, one or more control aspects of the present invention may be embodied as a system, method or computer program product. Accordingly, one or more control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 11:
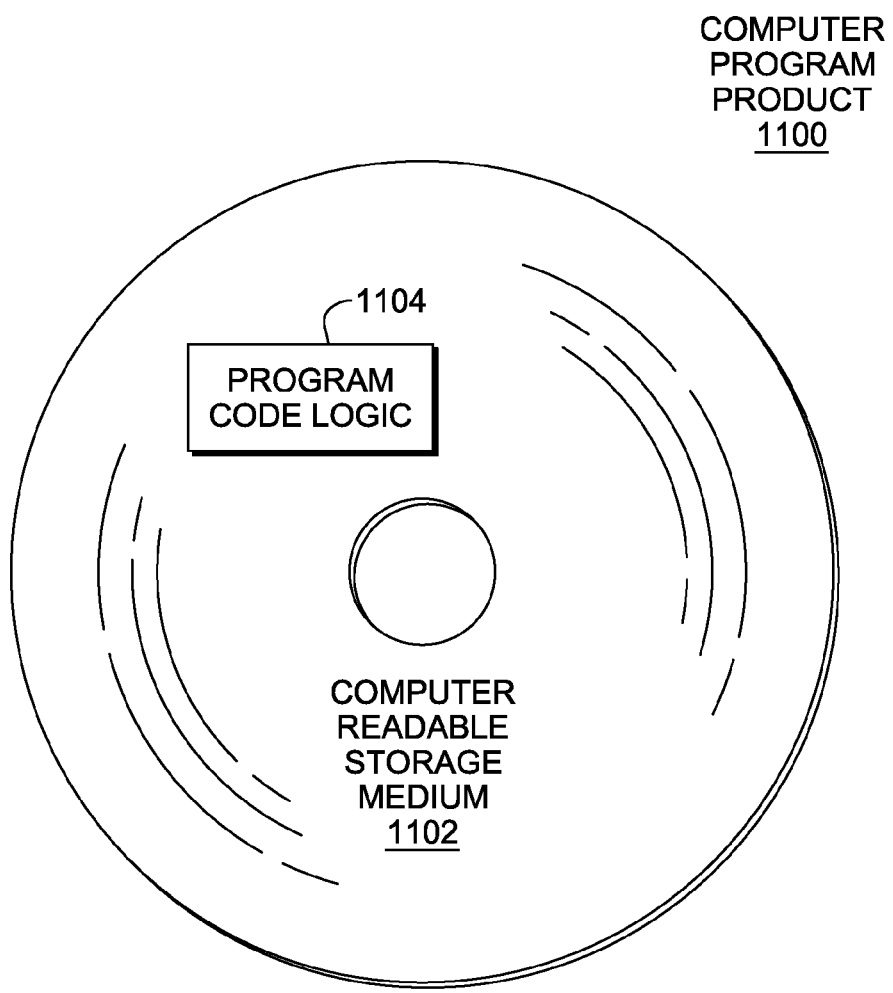
FIG. 11 depicts one embodiment of a computer program product incorporating one or more aspects of the present invention.

Referring now to FIG. 11, in one example, a computer program product 1100 includes, for instance, one or more non-transitory computer readable storage media 1102 to store computer readable program code means or logic 1104 thereon to provide and facilitate one or more control aspects of the present invention.

Program code embodied on a computer readable medium may be transmitted using an appropriate medium, including but not limited to, wireless, wireline, optical fiber cable, RF, etc., or any suitable combination of the foregoing.

Computer program code for carrying out operations for one or more aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

One or more control aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of one or more control aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more control aspects of the present invention may be provided, offered, deployed, managed, serviced, etc. by a service provider who offers management of customer environments. For instance, the service provider can create, maintain, support, etc. computer code and/or a computer infrastructure that performs one or more control aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more control aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. Further, other types of computing environments can benefit from one or more aspects of the present invention.

As a further example, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining a coolant loop configured to circulate coolant therethrough and facilitate cooling at least one electronic component, wherein at least a portion of the coolant loop is exposed to outdoor ambient air temperature(s) during normal operation;
   providing at least one coolant tank comprising a first reservoir containing at least partially a first fluid, and a second reservoir containing at least partially a second fluid, the first fluid freezing at a lower temperature than the second fluid, the second fluid having superior cooling properties compared with the first fluid, and the first fluid and the second fluid being soluble fluids, the coolant within the coolant loop comprising at least the second fluid;
   providing multiple valves to selectively couple in fluid communication the at least one coolant tank to the coolant loop, the multiple valves comprising:
     a coolant diverter valve in the coolant loop and coupling the coolant loop to the first reservoir via a first reservoir inlet line;
     a first reservoir outlet valve associated with a first reservoir outlet line coupling the first reservoir directly to the coolant loop; and
     a second reservoir outlet valve associated with a second reservoir outlet line coupling the second reservoir directly to the coolant loop; and
   providing a controller to automatically control the multiple valves and vary the concentration level of the first fluid in the coolant within the coolant loop based on at least one of historical, current, or anticipated outdoor ambient air temperature(s) for a time of year, the controller automatically varying the concentration level of the first fluid in the coolant within the coolant loop by:
     automatically controlling the coolant diverter valve to controllably redirect a fractional amount of the coolant in the coolant loop into the first reservoir via the first reservoir inlet line; and
     commensurate with the redirecting of the fractional amount of the coolant, at least one of:
       increasing the concentration of the first fluid in the coolant by automatically controlling the first reservoir outlet valve to direct a commensurate amount of the first fluid in the first reservoir into the coolant loop as the fractional amount of the coolant is redirected into the first reservoir; or
       decreasing the concentration of the first fluid in the coolant by automatically controlling the second reservoir outlet valve to direct a commensurate amount of the second fluid in the second reservoir into the coolant loop as the fractional amount of the coolant is redirected into the first reservoir; and wherein the controller further initiates fractional distillation of the coolant within the first reservoir to facilitate separating the first fluid into the first reservoir and the second fluid into the second reservoir, the fractional distillation resulting in boiling of the second fluid in the first reservoir, wherein second fluid vapor rises within the first reservoir, and passes via a vapor passageway between the first reservoir and the second reservoir into the second reservoir, leaving a higher concentration of the first fluid in the first reservoir.

2. The method of claim 1, wherein the controller is configured to automatically vary the concentration level of the first fluid in the coolant loop for the time of year by balancing inhibiting freezing of the coolant within the coolant loop with heat transfer capability of the coolant within the coolant loop.

3. The method of claim 1, wherein the second reservoir further comprises a second fluid vapor condenser for condensing the second fluid vapor within the second reservoir.

4. The method of claim 1, wherein the first reservoir further comprises a first fluid vapor condenser for condensing any first coolant vapor within the first reservoir resulting from the fractional distillation of the fluid while allowing the second fluid vapor to pass via the vapor passageway from the first reservoir into the second reservoir, wherein the first fluid vapor condenses at a higher temperature than the second fluid vapor.

5. The method of claim 4, wherein the coolant loop is a primary coolant loop, and wherein the method further comprises providing a supplemental coolant loop with a liquid-to-air heat exchanger and a pump coupled in fluid communication therewith, the supplemental coolant loop being coupled to the first fluid vapor condenser in the first reservoir and facilitating cooling of the first fluid vapor condenser, and thereby condensing of the first fluid vapor within the first reservoir, wherein a supplemental coolant within the supplemental coolant loop is maintained at a temperature above a temperature at which the second fluid vapor condenses.

6. The method of claim 1, wherein the controller automatically controls the multiple valves to decrease the concentration level of the first fluid in the coolant within the coolant loop by diverting at least a portion of the coolant within the coolant loop into the first reservoir of the at least one coolant tank while directing the second fluid in the second reservoir into the coolant loop.

7. The method of claim 6, wherein the controller further initiates fractional distillation of the coolant within the first reservoir to facilitate separating the first fluid into the first reservoir and the second fluid into the second reservoir, the fractional distillation resulting in boiling of the second fluid in the first reservoir, wherein second fluid vapor rises within the first reservoir, and passes via a vapor passageway between the first reservoir and the second reservoir into the second reservoir, leaving a higher concentration of the first fluid in the first reservoir.

8. The method of claim 7, wherein the second reservoir further comprises a second fluid vapor condenser for condensing the second fluid vapor within the second reservoir.

9. The method of claim 8, wherein the controller controls the multiple valves to also divert a portion of the coolant within the coolant loop through the second fluid vapor condenser to facilitate condensing of the second fluid vapor within the second reservoir.

10. The method of claim 7, wherein the first reservoir further comprises a first fluid vapor condenser for condensing any first fluid vapor within the first reservoir resulting from the fractional distillation of the coolant while allowing the second fluid vapor to pass via the vapor passageway from the first reservoir into the second reservoir, wherein the first fluid vapor condenses at a higher temperature than the second fluid vapor.

11. The method of claim 10, wherein the coolant loop is a primary coolant loop, and wherein the method further comprises providing a supplemental coolant loop with a liquid-to-air heat exchanger and a pump coupled in fluid communication therewith, the supplemental coolant loop being coupled to the first fluid vapor condenser in the first reservoir and facilitating cooling of the first fluid vapor condenser, and thereby condensing of the first fluid vapor within the first reservoir, wherein a supplemental coolant within the supplemental coolant loop is maintained at a temperature above a temperature at which the second fluid vapor condenses.

12. The method of claim 1, further comprising a first fluid concentration level sensor associated with the coolant loop, wherein the controller automatically closes one or more of the multiple valves to isolate the at least one coolant tank from the coolant loop upon reaching a desired concentration level of the first fluid within the coolant in the coolant loop for the time of year.

\* \* \* \* \*